United States Patent
Yamaki et al.

(10) Patent No.: US 6,643,193 B2
(45) Date of Patent: *Nov. 4, 2003

(54) SEMICONDUCTOR DEVICE, MICROCOMPUTER AND FLASH MEMORY

(75) Inventors: Takashi Yamaki, Kodaira (JP); Kan Takeuchi, Kokubunji (JP); Mitsuru Hirakii, Kodaira (JP); Toshihiro Tanaka, Akiruno (JP); Yutaka Shinagawa, Iruma (JP); Masamichi Fujito, Kodaira (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/247,301

(22) Filed: Sep. 20, 2002

(65) Prior Publication Data

US 2003/0016566 A1 Jan. 23, 2003

Related U.S. Application Data

(63) Continuation of application No. 09/939,708, filed on Aug. 28, 2001, now Pat. No. 6,477,090.

(30) Foreign Application Priority Data

Sep. 4, 2000 (JP) .......................................... 2000-267044

(51) Int. Cl.[7] ................................................ G11C 7/00
(52) U.S. Cl. ............................ 365/189.09; 365/189.01; 365/185.21
(58) Field of Search ........................ 365/189.09, 226, 365/189.01, 185.21, 225, 185.33

(56) References Cited

U.S. PATENT DOCUMENTS

| 5,300,824 A | * | 4/1994 | Iyengar ...................... 327/540 |
| 5,910,916 A | | 6/1999 | Akaogi et al. ......... 365/185.09 |
| 6,014,329 A | | 1/2000 | Akaogi et al. ......... 365/185.09 |
| 6,337,819 B1 | * | 1/2002 | Shinozaki .................... 365/201 |
| 6,388,695 B1 | * | 5/2002 | Nagumo ..................... 347/237 |
| 6,477,090 B2 | * | 11/2002 | Yamaki et al. ......... 365/189.09 |
| 2001/0019499 A1 | * | 9/2001 | Ishibashi et al. ............ 365/182 |

FOREIGN PATENT DOCUMENTS

| JP | 10-214496 | 8/1998 |
| JP | 11-007783 | 1/1999 |
| JP | 11-145393 | 5/1999 |

* cited by examiner

*Primary Examiner*—David Nelms
*Assistant Examiner*—Gene N. Auduong
(74) *Attorney, Agent, or Firm*—Miles & Stockbridge P.C.

(57) ABSTRACT

A semiconductor device whose characteristics are highly reliably regulated for circuits whose desired characteristics need to be realized without being affect by unevenness in device characteristics is to be provided. A replica MOS transistor for amperage measurement connected to an external measuring terminal is provided. A delay circuit and other circuits whose desired characteristics are to be realized have a constant current source MOS transistor formed in the same process as the replica MOS transistor, and a trimming voltage vtri is commonly applied to the respective gates of the constant current source MOS transistor and the replica MOS transistor. Trimming data determined on the basis of an amperage measured from the external measuring terminal are stored into a memory means such as an electrically rewritable non-volatile memory or the like. The trimming data determine the trimming voltage vtri.

3 Claims, 22 Drawing Sheets

| PROGRAMMING DATA | I/O 4 | I/O 0 | DLL | DLR |
|---|---|---|---|---|
| 01 | 0 | 1 | 0 | 1 |
| 00 | 0 | 0 | 0 | 0 |
| 10 | 1 | 0 | 1 | 0 |
| 11 | 1 | 1 | 1 | 1 |

SEMICONDUCTOR DEVICE, MICROCOMPUTER AND FLASH MEMORY

CROSS-REFERENCE TO RELATED APPLICATIONS

This application is a continuation of application Ser. No. 09/939,708 filed Aug. 28, 2001 now U.S. Pat. No. 6,477,090.

BACKGROUND OF THE INVENTION

The present invention relates to a semiconductor device having a circuit which is desired to perform as intended without being affected by any unevenness in device characteristics among lots/wafers/chips, temperature fluctuation or the like, for instance a microcomputer or a flash memory, and to a method of adjusting the characteristics of the semiconductor device, for instance a technique which can be effectively applied to a microcomputer with a built-in flash memory.

Semiconductor devices may run into performance deterioration as circuit characteristics deviate from the desired performance characteristics intended in the circuit design as a consequence of some unevenness in the manufacturing process. Remedies for such performance deterioration include, for instance a technique to make a constant amperage adjustable in a semiconductor device with a built-in constant amperage source, and the Japanese Published Unexamined Patent Application No. Hei 11(1999)-7783 describes an EEPROM for adjusting the programming time by setting a desired constant amperage according to trimming data. The Japanese Published Unexamined Patent Application No. Hei 11(1999)-145393 discloses a method by which the amperage ratio of a current mirror circuit is measured and a transistor is selected according to a mask pattern. Further, according to the Japanese Published Unexamined Patent Application No. Hei 10(1998)-214496, a trimming circuit for allowing fine adjustment of the output voltage of a voltage clamping means against process fluctuations of a semiconductor device, such as a microcomputer, and this trimming circuit is controlled with a trimming control means according to trimming adjustment information. The technique disclosed in the patent application further provides for a register in which the trimming adjustment information is to be set, and the trimming adjustment information is transferred from a specific area in a non-volatile memory to this register to perform trimming as desired with software.

SUMMARY OF THE INVENTION

However, according to the Japanese Published Unexamined Patent Application No. Hei 11(1999)-7783, a desired transistor is selected out of a plurality of transistors differing in threshold voltage according to trimming data to adjust the programming time and the output of a timer circuit is adjusted to keep the programming time constant all the time, but there is no mention of how to select the desired transistor. Regarding the method disclosed in the Japanese Published Unexamined Patent Application No. Hei 11(1999)-145393, by which the amperage ratio of a current mirror circuit is measured and a transistor is selected according to a mask pattern, but trimming to bring the amperage ratio, which is a characteristic of a current mirror circuit, into a desired state is often rather difficult. Therefore, the present inventor has found that this would invite elongation of the time required to acquire trimming data, i.e. the testing time, and the accuracy of adjustment by trimming tends to be poor. Nor is there any mention in the Japanese Published Unexamined Patent Application No. Hei 10(1998)-214496 as to how trimming information is to be determined.

Examination by the present inventor has revealed that it would not be easy to accurately monitor the output time of the timer circuit according to, for instance, the Japanese Published Unexamined Patent Application No. Hei 11 (1999)-7783. Though there is no mention of this point in its specification, it may be possible to acquire trimming data according to which a desired transistor is to be selected out of a plurality of transistors differing in threshold voltage by externally measuring the output time of the timer circuit via an I/O port or the like, but there are not a few parasitic capacitors and resistors on the path of measurement from the timer circuit to the I/O port via an internal bus, and the obtuseness or distortion of signal waveforms they give rise to is likely to make accurate measurement difficult. The testing system will be made complex, moreover. It is desirable to perform trimming lot by lot, wafer by wafer or chip by chip, and there is the remaining problem of an extended testing time.

In particular, within a chip, often there are a plurality of circuits to be trimmed apart from a timer circuit. In such a case, the testing time will be further extended if the characteristics are measured circuit by circuit and trimming data are acquired individually, resulting in a corresponding increase in testing cost.

An object of the present invention is to provide a semiconductor device, such as a microcomputer or a flash memory, facilitating measurement for acquisition of control data (trimming data) for use in the adjustment of circuit characteristics.

Another object of the invention is to provide a semiconductor device, such as a microcomputer or a flash memory, serving to reduce the time taken to acquire trimming data.

Still another object of the invention is to provide a semiconductor device, such as a microcomputer or a flash memory, making possible highly reliable adjustment of the characteristics of circuits which are desired to have intended characteristics unaffected by unevenness of device characteristics or the like.

The above-stated and other objects and novel features of the present invention will become apparent from the description in this specification and the accompanying drawings.

What follows is a brief summary of typical aspects of the present invention disclosed in this application.

[1] A semiconductor device according to the invention has, formed over one semiconductor chip, a control voltage generating circuit (10) for generating a control voltage on the basis of control data; circuits (4, etc.) using a constant current source generating a constant current on the basis of the control voltage; a current measuring transistor (2) whose control terminal is connected to a signal line for providing the control voltage to the constant current source; an external measuring terminal (3), connected to the current terminal of the current measuring transistor, for making possible external measurement of the current flowing in the current measuring transistor; and a memory means (13) for holding control data and providing them to the control voltage generating circuit. The control data are utilized for determining the characteristics of the circuits using the constant current source, and the choice of control data determines the characteristics of the pertinent circuit. When the characteristics of a given circuit are to be determined, control data are actually provided to the control voltage generating circuit to generate a control voltage, and the resultant current actually flowing in the current measuring transistor is observed at the external measuring terminal. The measurement is done either by connecting a current measuring apparatus to the external measuring terminal and measuring the amperage therewith, or applying a voltage to the external measuring terminal via a resistor having a known resistance and measuring the voltage with a voltage measuring apparatus arranged in parallel to the resistor. The measuring line within the semiconductor device has no intervening internal bus or I/O circuit and few undesirable parasitic capacitance components or wiring resistance components which distort observed signal waveforms to a substantial extent. The value of control data required for obtaining the desired constant current is acquired from the value of the control data at the time when the observed value has become equal to the target value or from the correlation between the observed value and the control data at the time. The value thereby obtained is stored into the memory means as the control data. The semiconductor device determines the constant current of the constant current source on the basis of the control data stored in the memory means. Therefore, the measurement for determining the constant current can be accomplished accurately and, moreover, in a short period of time, and constant current characteristics can be aligned with high reliability, unaffected by process unevenness.

Where a semiconductor device has a plurality of circuits each provided with a constant current source, the circuit for determining the control voltage can be restrained in dimensions, and the processing time required for determining the control voltage further shortened, by providing the control voltage commonly to the constant current source of each of the plurality of circuits.

As a specific form of the semiconductor device according to the invention, the constant current source includes a constant current source MOS transistor for receiving the control voltage at its control terminal for controlling mutual conductance. More preferably, the current measuring transistor should be a MOS transistor manufactured by the same process as the constant current source MOS transistor. This would make particularly clear the correlation between the measuring current flowing in the current measuring transistor and the constant current actually flowing in the constant current source MOS transistor. Taking into consideration the accuracy of current measurement by a tester or the like connect to the external measuring terminal for current measurement, if the current flowing in a single current measuring MOS transistor is no more than a few $\mu$A, the current measuring transistor may be configured of a plurality of MOS transistors of the same size as the constant current source MOS transistor and connected in parallel.

The current measuring MOS transistor is now taken up for consideration with a view to stabilizing the current source (current source MOS transistor). First, the n-channel type MOS transistor connected in a position distant from the power supply terminal is less susceptible to the influence of power supply fluctuations than a p-channel type MOS transistor. With this factor taking into account, the current measuring MOS transistor formed in the same process as the constant current source MOS transistor should desirably consist of an n-channel type MOS transistor. From the viewpoint of current fluctuations, the current measuring MOS transistor formed in the same process as the constant current source MOS transistor should desirably be operated in a saturation current region. From the viewpoint of threshold voltage, the current measuring MOS transistor formed in the same process as the constant current source MOS transistor should desirably have a channel length entailing little fluctuation of threshold voltage accompanying unevenness in channel length. It is further desirable for the current measuring MOS transistor to have a channel width entailing little fluctuation of threshold voltage accompanying unevenness in channel width. In short, for the current measuring MOS transistor, the channel length and width should desirably be greater than for the MOS transistor constituting a logic circuit.

As a specific form of the semiconductor device according to the invention, the constant current source may have a constant current source MOS transistor, which receives the control voltage at its control terminal to undergo control of mutual conductance, and a current mirror load, and use a constant current source circuit capable of supplying a constant voltage.

In this case, the circuit using the constant current source may be, for instance, a delay circuit (4) having a delay element, and the delay time of the delay element is controlled with a constant voltage supplied from the constant current source circuit. In another example the circuit using the constant current source may be a ring oscillator (5) having a plurality of delay elements, and the delay time of each delay element is controlled with a constant voltage supplied from the constant current source circuit. In another example, the circuit using the constant current source may be a timer (6) provided with a ring oscillator having a plurality of delay elements and a counter for counting periodic signals supplied from the ring oscillator and supplying pulse signals, and the delay time of each delay element is controlled with a constant voltage supplied from the constant current source circuit.

In another example, the circuit using the constant current source may have as a circuit for selective flowing of a constant current a first MOS transistor (M15A), a second MOS transistor (M15B), each receiving at its control terminal a constant voltage (voltage N5) supplied from the constant current source circuit, and a third MOS transistor (M16A) arranged between the first and second MOS transistors and subjected to switching control. This arrangement can restrain a situation in which the constant voltage is fluctuated by capacitance coupling via the gate capacitance of a MOS transistor because, where the third MOS transistor is cut off, the state of capacitance coupling to the constant voltage via the gate capacitance of the first MOS transistor connected to the higher potential side and the state of capacitance coupling to the constant voltage via the gate capacitance of the second MOS transistor connected to the lower potential side tend to vary in a complementary way when the third MOS transistor is turned to start flowing of a constant current, and therefore it is made possible to stabilize at a constant amperage the current flowing in the first through third MOS transistors. In another example, the circuit using the constant current source may have as a circuit for selective flowing of a constant current for the discharging purpose the first MOS transistor (M15A), the second MOS transistor (M15B), each receiving at its control terminal a constant voltage (voltage N5) supplied from the constant current source circuit, the third MOS transistor (M16A) arranged between the first and second MOS transistors and subjected to switching control, and a fourth MOS transistor (M16B) as a circuit for selective flowing of a constant current for the discharging purpose, subjected to switching control in a complementary way with the third MOS transistor and connected in series to the second MOS transistor. In another example, the circuit using the constant current source may have as a first circuit for selective flowing of a constant current for the discharging purpose a first MOS transistor (M4A), a second MOS transistor (M4B), each receiving at its control terminal a first constant voltage (voltage N1) from the constant current source circuit, a third MOS transistor (M10A) arranged between the first and second MOS transistors and subjected to switching control, and as a second circuit for selective flowing of a constant current for the discharging purpose a fourth MOS transistor (M7A) and a fifth MOS transistor (M7B), each receiving at its control terminal a second constant voltage (voltage N2) supplied from the constant current source circuit, a sixth MOS transistor (M10B) arranged between the fourth and fifth MOS transistors and subjected to switching control.

In another example, the circuit using the constant current source may be clamp circuit (7) having a differential amplifier having the constant current source MOS transistor as its constant current source and an output circuit receiving at its control terminal the differential output voltage of the differential amplifier, the clamp circuit being capable of control by feeding back the output voltage of the output circuit to a constant voltage via the differential amplifier.

In another mode of implementing the invention, a semiconductor device may have a built-in circuit module permitting electrical rewriting of stored information, such as a flash memory. In this case, the semiconductor device has a non-volatile memory element whose threshold voltage is programmable, a reference circuit (8) for generating a decision level for a voltage emerging on a data line correspondingly to the threshold voltage of the non-volatile memory element, and a sense amplifier (86) for comparing the decision level of the reference circuit and the voltage emerging on the data line correspondingly to the threshold voltage of the non-volatile memory element. The reference circuit is configured of a circuit having the constant current source MOS transistor on its discharge path. This can be considered a specific example of circuit using the constant current source.

The reference circuit has as a circuit for selective flowing of a constant current a first MOS transistor (M33), a second MOS transistor (M34), each receiving at its control terminal the control voltage (vtri), and a third MOS transistor (M35) arranged between the first and second MOS transistors and subjected to switching control. As described above, this arrangement can restrain a situation in which the constant voltage applied to the gates of the first and second MOS transistors is fluctuated by capacitance coupling via the gate capacitance of a MOS transistor, stabilize at a constant amperage the current flowing in the reference circuit, and thereby realize stabilization of the comparing operation by the sense amplifier.

Here is supposed, like the foregoing, the semiconductor device has a built-in circuit module permitting electrical rewriting of stored information, such as a flash memory. In this case, the semiconductor device has a non-volatile memory element whose threshold voltage can be electrically altered; a program control circuit for controlling the alteration of the threshold voltage for the non-volatile memory element, and a verify sense amplifier (9) for detecting whether or not the alteration of the threshold voltage by the program control circuit has been completed. The verify sense amplifier has a logic gate (89) connected to the data terminal of the non-volatile memory element and having a prescribed logic threshold voltage; a constant current source circuit having the constant current source MOS transistor (M37) and generating a constant voltage in the vicinity of the logic threshold voltage on the basis of a constant current flowing in the transistor; and a load MOS transistor (M39) which receives a constant voltage generated by the constant current source circuit to be subjected to mutual conductance control, supplies a current to the data terminal of the non-volatile memory element and, when the threshold voltage of the non-volatile memory element has reached a prescribed state, controls the input to the logic gate to a level in the vicinity of the logic threshold voltage.

As another mode of implementing the invention, here is supposed a case in which the external measuring terminal is concurrently used for another purpose. In this case, a first selecting means (M40) is provided between the external measuring terminal and the current measuring MOS transistor, and some other circuit is connected between the external measuring terminal and the first selecting means via a second selecting means (M41). Obviously, the external measuring terminal can as well be caused to function as a terminal exclusively intended for current measurement.

The other circuit mentioned above may be, for instance, a voltage output circuit (95) for supplying a voltage corresponding to voltage control data stored in a memory means. The voltage supplied by this voltage output circuit is made observable from the external measuring terminal via the second selecting means. In this case, it is preferable to determine control data for the current control after the voltage control data have been determined. If the voltage output circuit is, for instance, the control voltage generating circuit, there is no sense in making definite the control data for determining the constant current unless the voltage output characteristic is determined first.

[2] A microcomputer (70) pertaining to a second aspect of the present invention comprises a CPU (71) and other circuits formed over one semiconductor chip, wherein the other circuits include a control voltage generating circuit for generating a control voltage on the basis of control data; a circuit using a constant current source MOS transistor for generating a constant current on the basis of the control voltage; a current measuring MOS transistor whose control terminal is connected to a path for supplying the control voltage to the constant current source MOS transistor; an external measuring terminal, connected to the current terminal of the current measuring MOS transistor, for making the current flowing in the current measuring MOS transistor measurable from outside the semiconductor chip; and a memory means for holding control data and providing them to the control voltage generating circuit. In this microcomputer, too, as in the above-described semiconductor device, the measuring line within the microcomputer has no intervening internal bus or I/O circuit and few undesirable parasitic capacitance components or wiring resistance components which distort observed signal waveforms to a substantial extent, and therefore the measurement for determining the constant current can be accomplished accurately and, moreover, in a short period of time, so that constant current characteristics can be aligned with high reliability, unaffected by process unevenness.

In a specific form of a microcomputer pertaining to the present invention, the memory means may be a non-volatile memory permitting no electrical rewriting of stored information, such as an electric fuse circuit. In another mode, the memory means may be a non-volatile memory permitting electrical rewriting of stored information, such as a flash memory. In another form, the memory means may further comprise registering means (13B, 13V) to which control data are transferable from the non-volatile memory and control data are also transferable from outside, and the transferred control data are supplied to a control voltage generating circuit. The use of the registering means facilitates the operation to set control data when measurement is done using an external measuring terminal. A non-volatile memory permitting electrical rewriting at the time of measurement would save the trouble of rewriting control data every time.

In another form of the microcomputer according to the invention, the aforementioned other circuits may include a flash memory accessible by a CPU, wherein the flash memory has an array of non-volatile memory elements whose threshold voltages are electrically alterable; a program circuit for altering the threshold voltages of the non-volatile memory elements; and a read circuit for reading information stored in the non-volatile memory elements. The read circuit has a reference circuit for generating a decision level for a voltage emerging on a data line correspondingly to the threshold voltage of the non-volatile memory element and a sense amplifier for comparing the decision level of the reference circuit and the voltage emerging on the data line correspondingly to the threshold voltage of the non-volatile memory element. The reference circuit uses the constant current source MOS transistor on whose discharge path the constant current source MOS transistor intervenes.

In a more specific form, the reference circuit consists of a first constant current source MOS transistor, a second constant current source MOS transistor, each receiving at its control terminal the control voltage, and a third MOS transistor arranged between the first and second MOS transistors and subjected to switching control, wherein a constant current is made to flow in the on-state of the third MOS transistor.

In another specific form, the program circuit has a verify sense amplifier for detecting whether or not the alteration of the threshold voltage by the program control circuit has been completed, wherein the verify sense amplifier has a logic gate connected to the data terminal of the non-volatile memory element and having a prescribed logic threshold voltage; a constant current source circuit having the constant current source MOS transistor and generating a constant voltage in the vicinity of the logic threshold voltage on the basis of a constant current flowing in the transistor; and a load MOS transistor which receives a constant voltage generated by the constant current source circuit to be subjected to mutual conductance control, supplies a current to the data terminal of the non-volatile memory element and, when the threshold voltage of the non-volatile memory element has reached a prescribed state, controls the input to the logic gate to a level in the vicinity of the logic threshold voltage.

In another specific form, the program circuit may either have one non-volatile memory element hold one bit of stored information or have one non-volatile memory element hold two bits or more of stored information. Thus, the program circuit sets each non-volatile memory element to one of four or more threshold voltages designated by a plurality of bits of programming data, and the read circuit causes each nonvolatile memory element to supply the state of threshold voltage as a corresponding plurality of bits of stored information, resulting in the realization of a multi-value flash memory in which stored information in one non-volatile memory element is provided in a plurality of bits.

In another form of the microcomputer according to the invention, the aforementioned other circuits may include a RAM accessible by a CPU, wherein the RAM has an array of volatile memory elements, a write circuit for writing into the volatile memory elements, and a read circuit for reading stored information in the volatile memory elements; the read circuit has a reference circuit for generating a decision level for a voltage emerging on a data line according to the stored information in the volatile memory elements and a sense amplifier for comparing the decision level of the reference circuit and the voltage emerging on the data line according to the stored information in the volatile memory elements. The reference circuit uses the constant current source MOS transistor on whose discharge path the constant current source MOS transistor intervenes.

[3] A flash memory pertaining to a third aspect of the present invention has, formed over one semiconductor chip, an array of non-volatile memory elements whose threshold voltages are electrically alterable; a program circuit for altering the threshold voltages of the non-volatile memory elements; and a read circuit for reading information stored in the non-volatile memory elements. Either or both of the program circuit and the read circuit include a circuit using a constant current source MOS transistor for receiving a constant current and generating a control voltage, and further has a signal line for providing the control voltage to the constant current source MOS transistor; a current measuring MOS transistor whose control terminal is connected to the signal line; an external measuring terminal, connected to the current terminal of the current measuring MOS transistor, for making the current flowing in the current measuring MOS transistor measurable from outside; a control voltage generating circuit for generating the control voltage on the basis of the control data; and a memory means for holding the control data and providing them to the control voltage generating circuit.

In a specific form of the flash memory, the read circuit has a reference circuit for generating a decision level for a voltage emerging on a data line according to the threshold voltages of the non-volatile memory elements and a sense amplifier for comparing the decision level of the reference circuit and the voltage emerging on the data line according to the threshold voltages of the non-volatile memory elements. The reference circuit uses the constant current source MOS transistor on whose discharge path the constant current source MOS transistor intervenes.

The reference circuit may consist of, for instance, a first constant current source MOS transistor, a second constant current source MOS transistor, each receiving at its control terminal the control voltage, and a third MOS transistor arranged between the first and second MOS transistors and subjected to switching control, wherein a constant current is made to flow in the on-state of the third MOS transistor.

The program circuit may have, for instance, a verify sense amplifier for detecting whether or not the alteration of the threshold voltages has been completed, wherein the verify sense amplifier has a logic gate connected to the data terminals of the non-volatile memory elements and having a prescribed logic threshold voltage; a constant current source circuit having the constant current source MOS transistor and generating a constant voltage in the vicinity of the logic threshold voltage on the basis of a constant current flowing in the transistor; and a load MOS transistor which receives a constant voltage generated by the constant current source circuit to be subjected to mutual conductance control, supplies a current to the data terminal of the non-volatile memory element and, when the threshold voltages of the non-volatile memory elements have reached a prescribed state, controls the input to the logic gate to a level in the vicinity of the logic threshold voltage.

In another specific form, the program circuit may either have one non-volatile memory element hold one bit of stored information or have one non-volatile memory element hold two bits or more of stored information. Thus, the program circuit sets each non-volatile memory element to one of four or more threshold voltages designated by a plurality of bits of programming data, and the read circuit causes each non-volatile memory element to supply the state of threshold voltage as a corresponding plurality of bits of stored information, resulting in the realization of a multi-value flash memory in which Stored information in one non-volatile memory element is provided in a plurality of bits.

DESCRIPTION OF THE PREFERRED EMBODIMENTS

Figure 1:
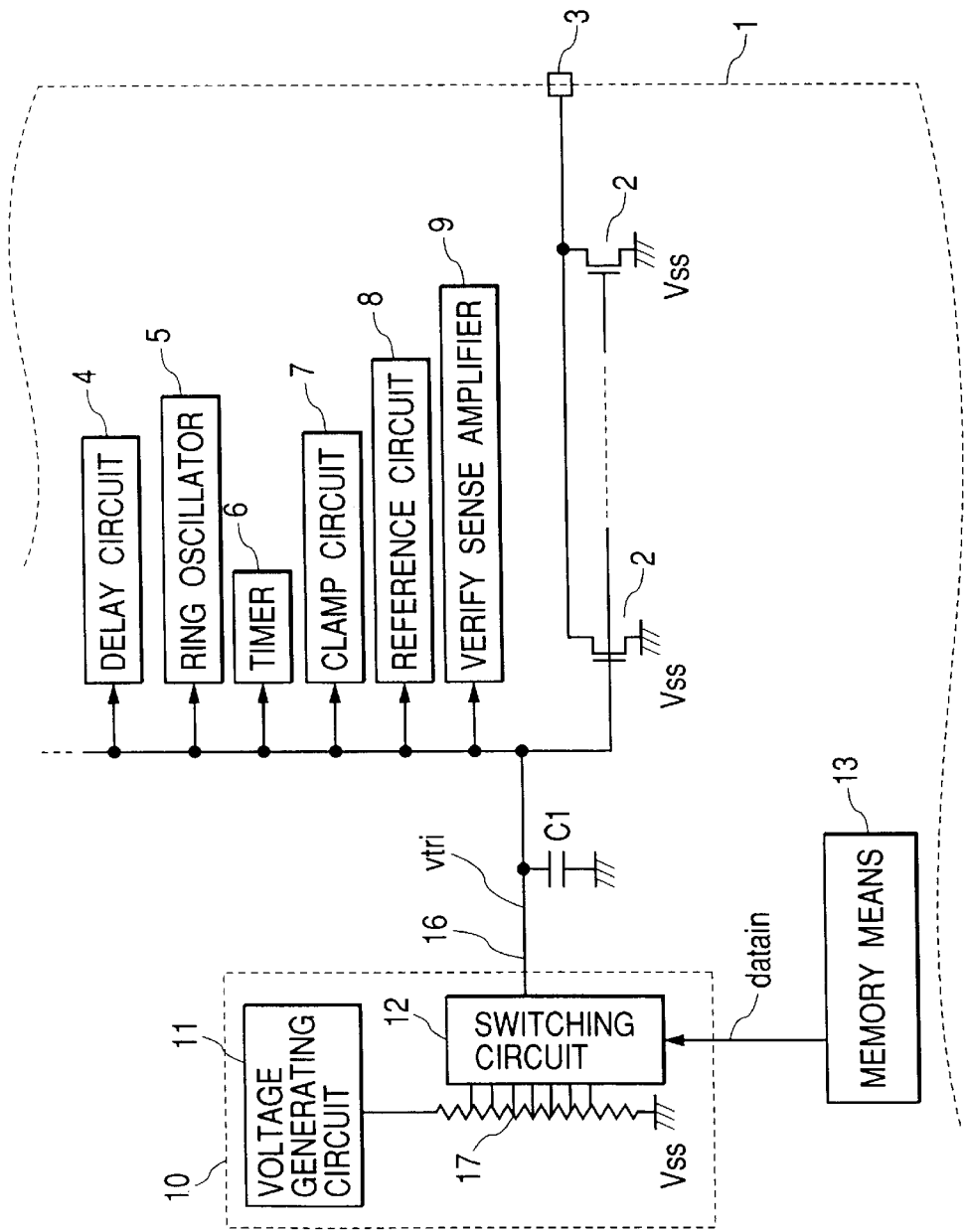
FIG. 1 is a block diagram illustrating one example of semiconductor device pertaining to the present invention.

FIG. 1 is a block diagram illustrating one example of semiconductor device pertaining to the present invention. Referring to FIG. 1, a semiconductor device 1 shown there is formed of a single semiconductor chip, and as representative circuits using a constant current source, there are illustrated, though not in a limiting way, a delay circuit 4, a ring oscillator 5, a timer 6, a clamp circuit 7, a reference circuit 8, and a verify sense amplifier 9. A constant current flowing from the constant current source is determined by a control voltage vtri on wiring 16. The control voltage vtri is generated by a control voltage generating circuit 10 on the basis of control data (hereinafter to be referred to also as trimming data) datain. The control voltage generating circuit 10 has, though its constituents are not necessarily limited to the following, a voltage generating circuit 11, a resistance type voltage dividing circuit 17 for resistance-dividing the voltage generated by the voltage generating circuit 11, and a switching circuit 12 for selecting one of the divided voltages generated by the resistance type voltage dividing circuit 17 according to the trimming data datain and supplying the selected divided voltage as the control voltage vtri. The trimming data datain, in response to resetting or the like of an electrically unrewritable non-volatile memory such as a fuse, an electrically rewritable non-volatile memory or a semiconductor device, are supplied from a memory means 13 such as a register, to which trimming data are transferred to the non-volatile memory, to the control voltage generating circuit 10. Therefore, the constant current flowing from the constant current source is determined by the trimming data datain.

As the measuring line for determining the trimming data, there is provided a current measuring MOS transistor (which may be referred to simply as a replica MOS transistor hereinafter) 2, whose gate electrode (control terminal) is coupled to the wiring 16. Though not absolutely required, a plurality of replica MOS transistors 2 may arranged in parallel, each consisting of an n-channel type unit, of which the source electrode is connected to the grounding voltage Vss of the circuit and the drain electrode, to an external measuring terminal 3.

The replica MOS transistor 2 may be, though not absolutely need to be formed by the same process as that for a constant current source MOS transistor (not shown in FIG. 1) contained in a constant current source in a circuit using the constant current source, typically the delay circuit 4, and more specifically in the same size as the constant current source MOS transistor. Both the gate electrode of the constant current source MOS transistor (not shown) and that of the replica MOS transistor 2 are coupled to the wiring 16.

While the description here refers to connection of the wiring 16 to the gate electrode of the matching MOS transistor and conductance control with the control voltage vtri, if similar current control functions are to be achieved by threshold voltage control, it will also be possible to connect the wiring 16 to the well region of the matching MOS transistor and perform threshold voltage control. Studies by the present inventor has revealed that, as will be described with reference to FIG. 2, it is more preferable, with a view to eliminating the temperature-dependence of the amperage of the constant current source MOS transistor, to connect the wiring 16 to the gate electrode. To the wiring 16 is connected a capacitor C1 to restrain fluctuations of the control voltage vtri.

Figure 2:
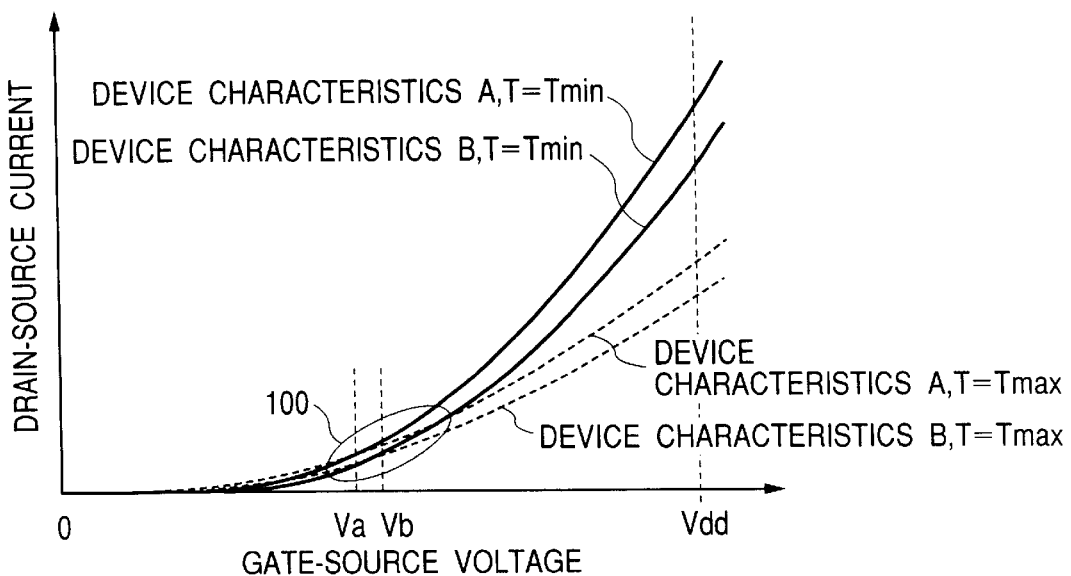
FIG. 2 is a graph showing the current characteristics of a MOS transistor.
Figure 3:
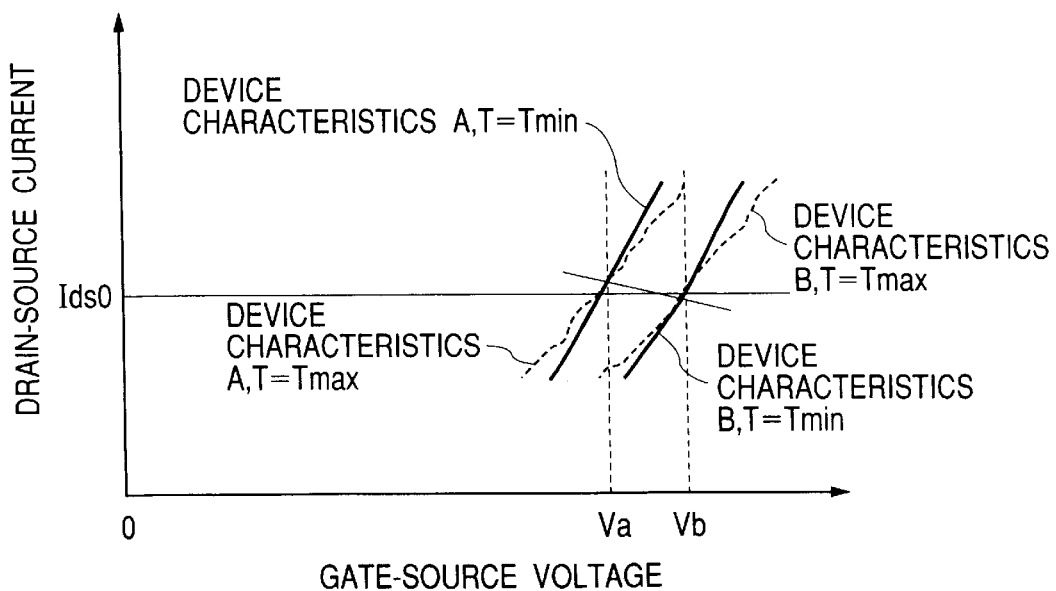
FIG. 3 is a graph showing the area 100 of FIG. 2 on an expanded scale.

FIG. 2 and FIG. 3 illustrate the current characteristics of the MOS transistor. This horizontal axis represents the voltage applied between the gate and the source, and the vertical axis, the current flowing between the drain and the source. The four curves each in FIG. 2 and FIG. 3 represent variations in amperage due to unevenness of the device characteristics and temperature fluctuations of the MOS transistor: characteristic A at which the amperage is at its maximum within the fluctuating range of the device characteristics and the temperature is at its minimum (T=Tmin) within the range to be guaranteed in the environment of the actual use of the semiconductor device; characteristic B at which the temperature is at its minimum (T=Tmin); device characteristic A and the temperature is at its maximum (T=Tmax); device characteristic B and the temperature is at its maximum (T=Tmax) Now, each of the delay circuit 4, ring oscillator 5, timer 6, clamp circuit 7, reference circuit 8 and verify sense amplifier 9 is configured of a circuit whose characteristics are dependent on the amperage of the current flowing in the constant current source MOS transistor. No matter whether the device characteristic is A or B, if the gate-source voltage of this constant current source MOS transistor is set in the area 100 where the lines of Tmin and Tmax come close to each other, the temperature-dependence of the amperage can be reduced.

FIG. 3 is a graph showing the area 100 of FIG. 2 on an expanded scale. For instance, the gate-source voltage is set to an amperage Ids0, which is the midpoint between the intersection point of Tmin and Tmax of device characteristic A and that of device characteristic B. This setting is done at a temperature, for instance, between Tmin and Tmax. If the device characteristic is A, the gate-source voltage is set to Va. If the device characteristic is B, the gate-source voltage is set to Vb. If the device characteristic is somewhere between A and B, the gate-source voltage is set to a certain value between Va and Vb. This gate-source voltage setting method gives a substantially constant amperage even if the device characteristic and the temperature vary. Therefore, by measuring the current flowing in the replica MOS transistor 2 from the external measuring terminal 3, determining the trimming data datain so as to cause the replica MOS transistor 2 to have the constant amperage Ids0, and regulating the current so that the amperage of the constant current source MOS transistor to be either equal to or a proportional multiple of the amperage of the replica MOS transistor 2, the characteristics of the delay circuit 4, ring oscillator 5, timer 6, clamp circuit 7, reference circuit 8 and verify sense amplifier 9 can all be made substantially constant independent of any unevenness in device characteristic or temperature variation. This enables the time required to acquire the trimming data to be shortened. Further, since the amperage measurement is a mere DC measurement by way of the external measuring terminal 3, it can be accomplished both easily and accurately. In other words, it only needs to connect a current measuring apparatus to the external measuring terminal 3 to measure the amperage, or to apply a voltage to the external measuring terminal 3 via a resistor having a known resistance and measuring the voltage with a voltage measuring apparatus arranged in parallel to the resistor. The measuring line within the semiconductor device has no intervening internal bus or I/O circuit and few undesirable parasitic capacitance components or wiring resistance components which distort observed signal waveforms to a substantial extent. Therefore, the measurement for determining the constant current can be accomplished accurately and, moreover, in a short period of time, and the constant current characteristics of different semiconductor devices can be aligned with high reliability, unaffected by process unevenness.

In FIG. 1, a plurality of n-channel type MOS transistors are shown as replica MOS transistors 2. Since the current flowing through a single replica MOS transistor 2 formed in the same size as the current source MOS transistor is only a few HA, considering the current measuring accuracy of a tester or the like to be connected to the external measuring terminal 3 for the measurement purpose, measurement can be facilitated by using a plurality of replica MOS transistors connected in parallel. It is also permissible to use only one replica MOS transistor 2.

The replica MOS transistor 2 may be a p-channel type unit, but more preferably be an n-channel type one. The reason is that, if a p-channel type MOS transistor is used, a power supply unit will be connected to its source, and this power, as it is often generated within the chip, is susceptible to voltage fluctuations, which in turn would make the amperage of the current flowing in the p-channel type MOS transistor susceptible to fluctuations. If the replica MOS transistor 2 is an n-channel type MOS transistor, no voltage fluctuation will occur because the source electrode is connected to the grounding voltage, and carrying out the aforementioned trimming would make it easier to keep the amperage of the current flowing in the n-channel type MOS transistor constant.

The constant amperage to be trimmed by the replica MOS transistor 2 is supposed to be in the saturation current region. This matches the operation of the constant current source MOS transistor in the saturation current region. Essentially, amperage fluctuations due to drain voltage variations of the MOS transistor can be thereby restrained.

Figure 4:
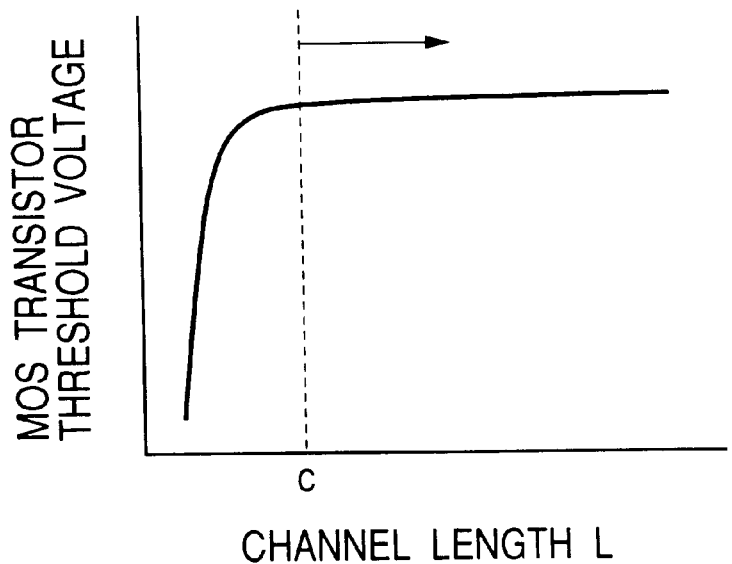
FIG. 4 is a graph showing the relationship between the channel length and the threshold voltage of the MOS transistor.
Figure 5:
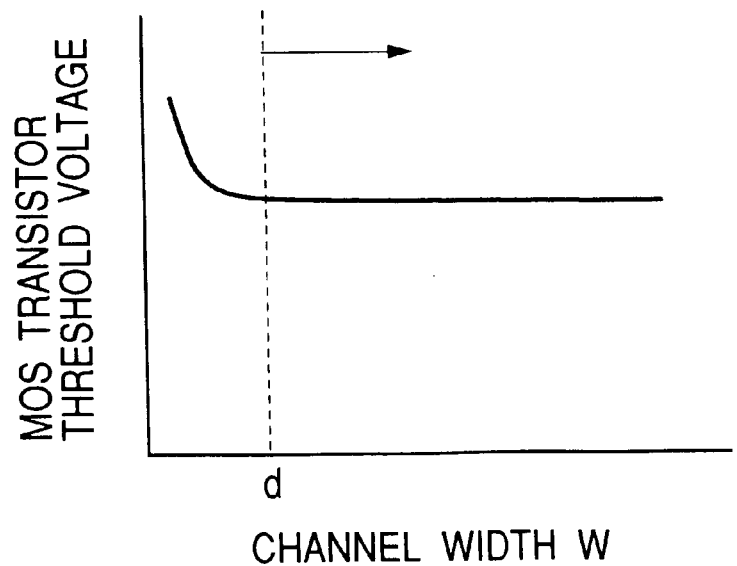
FIG. 5 is a graph showing the relationship between the channel width and the threshold voltage of the MOS transistor.

In FIG. 4, the horizontal axis of the channel length L of the MOS transistor and the vertical axis, the threshold voltage. Thus the relationship between L of the MOS transistor and the threshold voltage is shown. As L of the MOS transistor is shortened as shown in FIG. 4 the threshold voltage lowers at a certain value of L. For this reason, it is preferable for L of the replica MOS transistor 2 and L of the constant current source MOS transistor to be longer than c in FIG. 4. The reason is that the fluctuations of the threshold voltage, i.e. those of the amperage, due to the fluctuations of L of the MOS transistor, can be thereby eliminated. Similarly, in FIG. 5, the horizontal axis represents the channel width W of the MOS transistor and the vertical axis, the threshold voltage. Thus the relationship between W of the MOS transistor and the threshold voltage is shown. As W of the MOS transistor is narrowed as shown in FIG. 5, the threshold voltage rises at a certain value of W. For this reason, it is preferable for W of the replica MOS transistor 2 and W of the constant current source MOS transistor should preferably be greater than d in FIG. 5. The reason is that the fluctuations of the threshold voltage, i.e. those of the amperage, due to the fluctuations of W of the MOS transistor, can be thereby eliminated.

Figure 6:
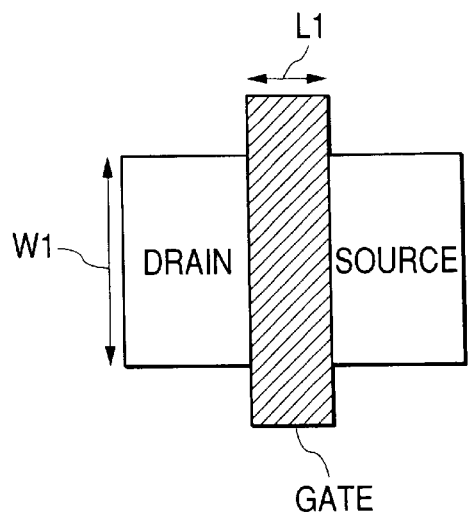
FIG. 6 is a plan of a replica MOS transistor and a constant current source MOS transistor.
Figure 7:
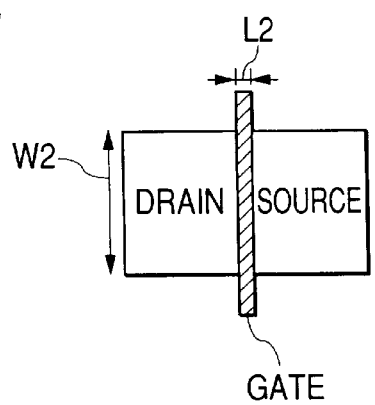
FIG. 7 is a plan of a MOS transistor commonly used in a logic circuit of a semiconductor device.

FIG. 6 is a plan of the replica MOS transistor 2 and the constant current source MOS transistor, and FIG. 7, a plan of the MOS transistor commonly used in the logic circuit of the semiconductor device according to the present invention. The replica MOS transistor 2 and the constant current source MOS transistor should have relationships of L1>L2 and W1>W2 to the MOS transistor commonly used in the logic circuit. By defining the design ranges of L and W of the replica MOS transistor 2 and the constant current source MOS transistor as stated above, a highly accurate constant current source can be obtained, resulting in an effect to reduce fluctuations in the characteristics of circuits using the current source.

Figure 8:
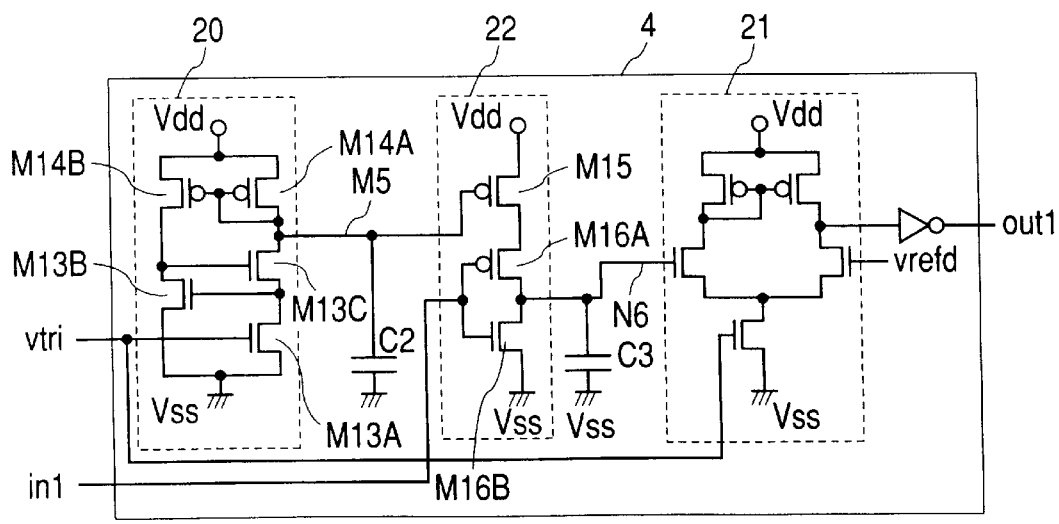
FIG. 8 is a circuit diagram typically illustrating details of a delay circuit.
Figure 9:
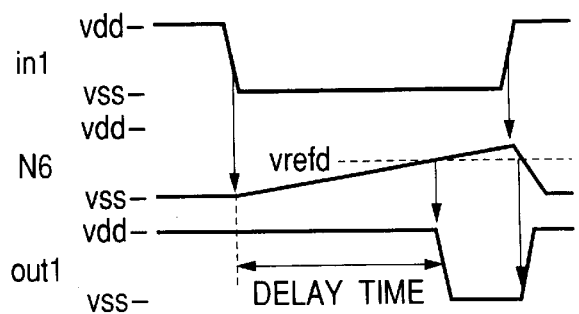
FIG. 9 is a timing chart typically illustrating the operating principle of the delay circuit of FIG. 8.

FIG. 8 typically shows details of the delay circuit 4, and FIG. 9, the operating principle of the delay circuit 4. The delay circuit 4 typically illustrated in FIG. 8, may have, though not absolutely need to have, an n-channel type constant current source MOS transistor M13A receiving at its gate electrode the control voltage vtri, n-channel type MOS transistors M13B and M13C intending to make current flow which is the same as that the constant current source MOS transistor M13A makes flow, and a current source circuit 20 consisting of p-channel type MOS transistors M14A and M14B constituting a current mirror load. In the MOS transistor M14A, the same current flows as in the constant current source MOS transistor M13A.

The inverter circuit 22 is composed by connecting a power supply load MOS transistor M15 to a CMOS inverter consisting of MOS transistors M16A and M16B. The transistors M16A and M16B constitute the CMOS inverter receiving an input signal in1, and the p-channel type MOS transistor M15 connected thereto in series receives at its gate electrode a constant voltage generated at a node N5 of the constant current source circuit 20. A comparator 21 configured of a differential amplifier compares the voltage at an output node N6 of the CMOS inverter with a reference voltage vrefd, and the result of comparison is reflected in a signal out1.

Referring to FIG. 8, the drain-source amperage of the n-channel type constant current source MOS transistor M13A is regulated to be substantially constant all the time by the feeding of the voltage vtri, which is determined by trimming data, to its gate electrode irrespective of any unevenness among lots, wafers or chips of semiconductor devices or any temperature variation. As the amperage of the current flowing in the MOS transistor M14A is equal to that of the current flowing in the MOS transistor M13A, if the MOS transistor M14A and the MOS transistor M15 are equalized in size, the amperage of the current flowing in the MOS transistor M15 is equal to that of the current flowing in the MOS transistor M13A as long as the MOS transistor M15 is operating in the saturation current region.

As typically shown in FIG. 9, when the voltage of the input signal in1 is caused to transition from the source voltage Vdd to the grounding voltage Vss, the current flowing in the MOS transistor M15 charges a capacitor C3, and raises the potential of the node N6. When the potential of the node N6 surpasses the reference voltage vrefd, the comparator 21 causes the signal out1 to transition from the source voltage Vdd to the grounding voltage Vss. It can be so designed that the MOS transistor M15 can operate substantially in the saturation current region when the potential of the node N6 is between 0 and vref and, because the amperage of the current flowing in the MOS transistor M15 then is constant all the time, the speed at which the potential of the node N6 rises is made constant. If the period from the time the input signal in1 transitions from the source voltage Vdd to the grounding voltage Vss until the time the signal out1 transitions from the source voltage Vdd to the grounding voltage Vss is supposed to be a delay time T, the delay time T is also constant. If, for instance, the replica MOS transistor 2 and the MOS transistor M13A are equalized in size and trimming is done so as to make the current flowing in the replica MOS transistor 2 Ids0 (replica), the delay time T can be set substantially equal to (capacitance of C3)×vrefd/Ids0. Therefore, a delay circuit having a substantially constant delay time T irrespective of any unevenness among lots, wafers or chips of semiconductor devices or any temperature variation can be realized. A capacitor C2 serves to stabilize the potential of the node N5 and thereby to stabilize the amperage of the current flowing in the MOS transistor M15.

Figure 10:
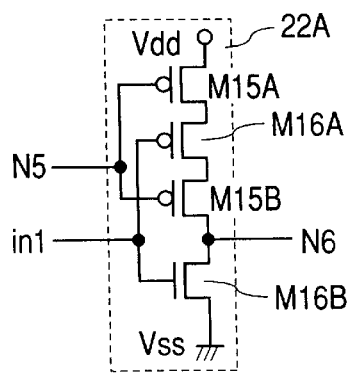
FIG. 10 is a circuit diagram illustrating another example of inverter circuit as a delay element.

FIG. 10 illustrates another example of inverter circuit 22 as a delay element. The inverter circuit 22A as a delay element shown in FIG. 10 is configured by bisecting the power supply load MOS transistor M15 into M15A and M15B and arranging the MOS transistor M15B between the MOS transistors M16A and M16B. The MOS transistors M15A and M15B are of the same type as the MOS transistor M15, and to its gate electrode is applied the control voltage vtri. This inverter circuit 22A can restrain the variation of the potential of the node N5 caused by capacitance coupling when an inverter connected to the input signal in1 operates, and stabilize the amperages of the currents flowing in the MOS transistors M15A and M15B at constant levels. Thus, in a state in which the MOS transistor M16A is cut off, the state of capacitance coupling to the node N5 via the gate capacitance of the MOS transistor M15A connected to the source voltage Vdd side and the state of capacitance coupling to the node N5 via the gate capacitance of the MOS transistor M15B connected to the grounding voltage Vss side tend to vary in a mutually complementary when a constant current starts flowing by turning on the MOS transistor M16A. Therefore, it is possible to restrain a situation in which the constant voltage of the node N5 is varied by capacitance coupling via the gate capacitances of the MOS transistors M15A and M15B, and accordingly to stabilize the amperages of the currents flowing in the MOS transistors M15A, M16A and M15B at constant levels.

Figure 11:
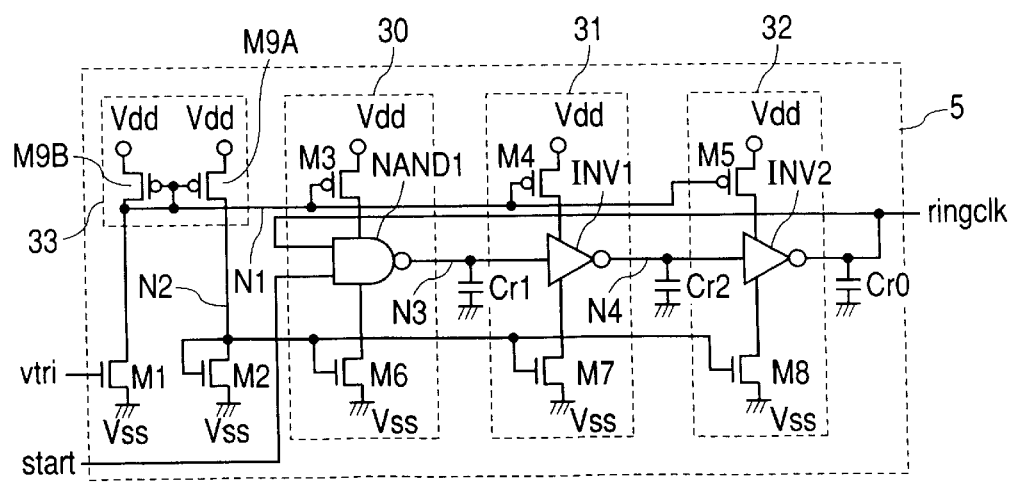
FIG. 11 is a circuit diagram typically illustrating details of a ring oscillator.

FIG. 11 illustrates a specific example of the ring oscillator 5. In FIG. 11, M1 denotes a constant current source MOS transistor, and MgA and MgB constitute a current mirror circuit 33. The current of the constant current source MOS transistor is controlled by the feeding of the voltage vtri determined by trimming data, and that current is kept constant by regulating the trimming data irrespective of any unevenness among lots, wafers or chips of semiconductor devices or any temperature variation. The MOS transistor M2 tends to let flow a current flowing in the MOS transistor M9A. Reference numerals 30, 31 and 32 denote feedback-connected three stages of delay elements. The delay element 30 is configured mainly of a NAND gate NAND1 and provided with power supply load MOS transistors M3 and M6. An oscillation control signal start inputted to one side of the NAND gate NAND1 indicates start of oscillation with its high level ("1") and stop of oscillation its low level ("0"). The delay element 31 is configured mainly of an inverter INV1 and provided with power supply load MOS transistors M4 and M7. The delay element 32 is configured mainly of an inverter INV2 and provided with power supply load MOS transistors M5 and M7.

In FIG. 11, the n-channel type MOS transistors M1, M2, M6, M7 and M8 are equal in size, and the p-channel type MOS transistors M9A, M9B, M3, M4 and M5 are also equal in size. The amperage of the current flowing in the MOS transistor M2 is equalized by the current mirror circuit 33 to that of the current flowing in the MOS transistor M1. Accordingly, the amperages of the currents flowing in the MOS transistors M3. M4, M5, M6, M7 and M8 are equal to that of the current flowing in the MOS transistor M1. When the signal start is raised to its high level, clocks of a prescribed period are supplied to an oscillation output ringclk. Then, as the amperages of the currents flowing in the transistors M3, M4, M5, M6, M7 and M8 are constant all the time, the response speeds of the NAND gate NAND1 and the inverters INV1 and INV2 take on constant values determined by the speeds of charging/discharging of capacitors Cr0, Cr1 and Cr2 by the constant current, so that the oscillation output ringclk supplies clocks of a constant period all the time.

Figure 12:
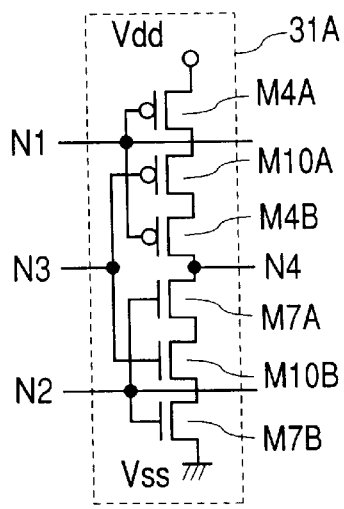
FIG. 12 is a circuit diagram illustrating another example of delay circuit contained in the ring oscillator.

FIG. 12 illustrates another example of delay circuit. The delay circuit 3aA of FIG. 12, by bisecting the MOS transistor M4 into M4A and M4B and the MOS transistor M7 into M7A and M7B, can restrain in the delay circuit 31 of FIG. 11 the variation of the potentials of a node N1 and a node N2 caused by capacitance coupling, as in the foregoing instance, when an inverter is operated by the MOS transistors M10A and M10B receiving the voltage of a node N3 as a switch control signal. As a result, the amperages of the currents flowing in the MOS transistors M4A, M10A and M4B or the MOS transistors M7A, M10B and M7B can be stabilized at constant levels.

Figure 13:
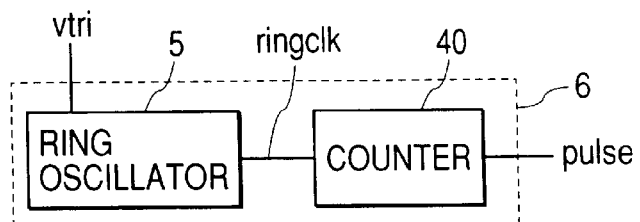
FIG. 13 is a block diagram illustrating a timer.

FIG. 13 illustrates an example of the timer 6. The timer 6 has the ring oscillator 5 and a counter 40. The counter 40 counts periodic signals ringclk supplied from the ring oscillator 5, and outputs a pulse pulse of a period corresponding to the count. The count to define the period is designated by the operating mode. As is evident from the foregoing description, since the signals ringclk are clock signals adjusted to a fixed period all the time, it is possible to realize a timer circuit capable of generating a pulse of a fixed and desired period irrespective of any unevenness among lots, wafers or chips of semiconductor devices or any temperature variation.

Figure 14:
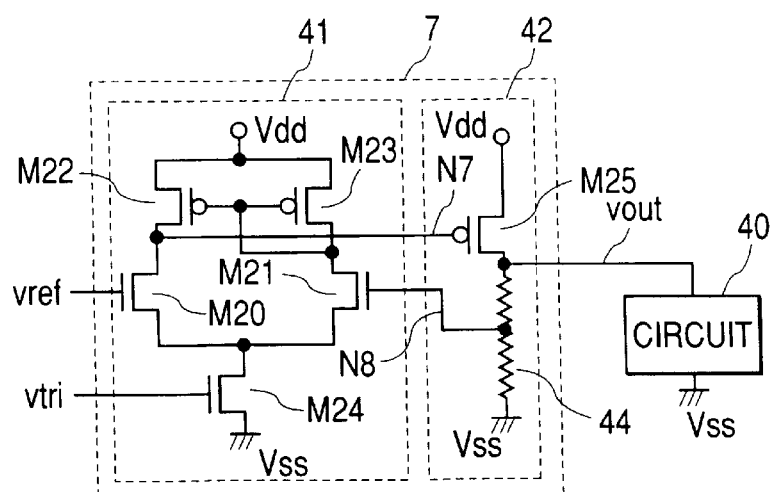
FIG. 14 is a circuit diagram typically illustrating details of a clamp circuit.

FIG. 14 illustrates an example of the clamp circuit 7. The clamp circuit 7 is configured of a differential amplifier 41 and an output circuit 42. The differential amplifier 41 consists of an n-channel type differential input MOS transistors M20 and M21, p-channel type current mirror load MOS transistors M22 and M23, and an n-channel type constant current source MOS transistor M24. To the gate electrode of the MOS transistor M24 is applied the control voltage vtri; to the gate electrode of the MOS transistor M21 is feedback-inputted the voltage of the node N8 of the output circuit 42; and to the gate electrode of the MOS transistor M20 is inputted a reference potential vref. The output circuit 42 has a p-channel type MOS transistor M25 which receives the voltage of the output node N7 of the differential amplifier 41 to be subjected to conductance control, has as its output voltage vout the drain voltage of this MOS transistor M25, and the voltage of the voltage dividing node N8 of a resistor circuit 44 fed back to the gate electrode of the differential input MOS transistor M21 which receives the output voltage vout.

If the output voltage vout is reduced by the current of a load circuit 43 when it is operating, the potential of the voltage dividing node N8 of the resistor circuit 44 will drop, is compared with a reference voltage vref, the potential of the node N7 will be controlled accordingly, and the amperage of the current flowing in M25 is controlled so as to recover the level of the output voltage vout. It is known that the greater the current consumption of the differential amplifier 41, the more the recovering force of the voltage vout will increase, i.e. the more the characteristic of the clamp circuit 7 will be enhanced. However, in order to ensure a certain level of recovering force for a conventional differential amplifier, the current consumption of the differential amplifier has to be designed against the worst conceivable case within the ranges of device characteristic unevenness and of temperature variation. If average device characteristic and temperature were assumed, the differential amplifier might consume a greater than necessary current. Here, the MOS transistor M24 of FIG. 14 is a constant current source MOS transistor, and the amperage of the current flowing in the MOS transistor M24 is kept substantially constant all the time by providing a voltage vtri level determined by trimming data. As a result, the current consumption by the differential amplifier 41 is kept constant, making possible a higher performance configuration for the clamp circuit 7, capable of ensuring a certain level of recovering force at a low current consumption.

Figure 15:
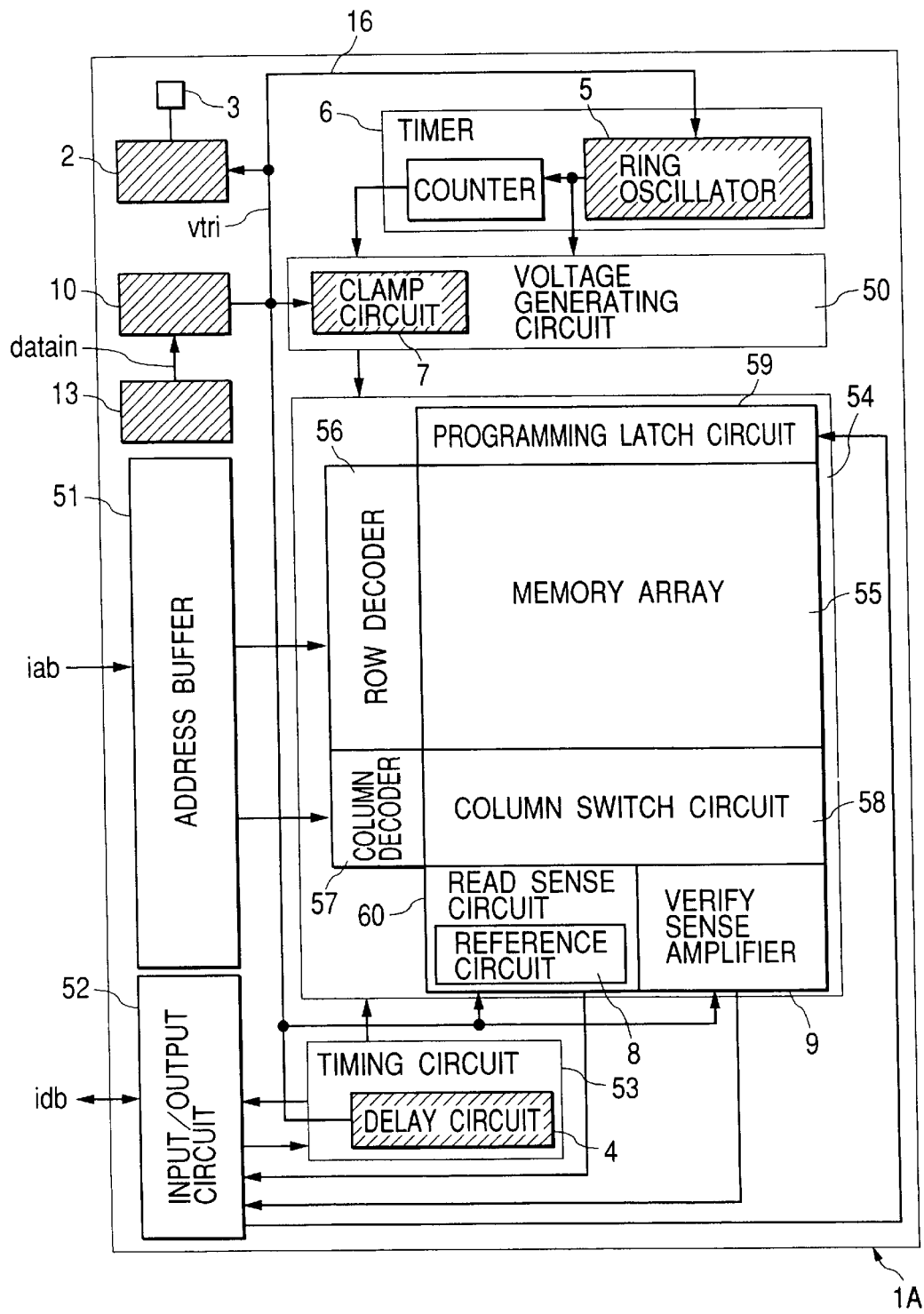
FIG. 15 is a block diagram illustrating a flash memory pertaining to the invention.

FIG. 15 illustrates an example of flash memory pertaining to the invention. The flash memory 1A shown in FIG. 15 may, though not absolutely need to, consist of a memory LSI formed in a single semiconductor chip. This flash memory 1A is a specific example of the semiconductor device 1 of FIG. 1, and has the delay circuit 4, ring oscillator 5, timer 6, clamp circuit 7, reference circuit (reference sense amplifier) 8 and verify sense amplifier 9 each using the constant current source MOS transistor which the semiconductor device 1 is provided with. As circuits for setting the constant current for those circuits each using the constant current source MOS transistor, there are provided the memory means 13, control voltage generating circuit 10, wiring 16, replica MOS transistor 2 and external measuring terminal 3. In addition to them, there are also a voltage generating circuit 50, address buffer 51, input/output circuit 52, timing circuit 53 and a memory section 54. The memory section 54 has a memory cell array 55, row decoder 56, column decoder 57, column switch circuit 58, programming latch circuit 59 and read sense circuit 60.

In the memory cell array 55, there are arranged electrically rewritable flash memory cells in a matrix form. Each flash memory cell has a source electrode, drain electrode, floating gate electrode and control gate electrode. The drain electrode is connected to a bit line, the source electrode to a source line and the control gate electrode to a word line. In the flash memory cells, the threshold voltage is made programmable, and information is held according to the programmed threshold voltage. For instance, where one flash memory cell is to hold one-bit information, a relatively high threshold voltage state is supposed to be the programming state, and a relatively low threshold voltage to be the erase state. Into the address buffer 51 is entered an address signal from an address bus iab, and the entered address signal is decoded by the row decoder 56 and the column decoder 57. According to the result of decoding by the row decoder 56, a word line is selected, and according to the result of decoding by the column decoder 57, a bit line is selected via the column switch circuit 58. The word line selection and the bit line selection cause a flash memory cell to be selected. In a read operation, read data in the selected flash memory cell are detected by a read sense circuit 609, and made possible to be outputted to a data bus idb via the input/output circuit 52. In a programming operation, programming data provided from the data bus idb to the input/output circuit 52 are latched by the programming latch circuit 59, and programming/non-programming elements are controlled according to the latched data for the word line-selected memory cell. In advance of programming, flash memory cells undergo erasion either block by block or source line by source line. A verifying operation to detect whether or not the threshold voltage of a given flash memory cell has reached a desired threshold voltage state in the programming and erasing operations is carried out via the verify sense amplifier 9.

The voltage generating circuit 50 has a charge pump circuit among others in addition to clamp circuit 7, and supplies various voltages for use in programming, erasion and reading operations of the flash memory. With the clamp circuit 7, this voltage generating circuit 50 is realized as a highly reliable circuit stably operating with the minimum required current consumption. The output of the ring oscillator 5 is connected to a circuit for controlling the pumping by the charge pump circuit so as to realize a charge pump circuit that can operate efficiently and stably with the minimum required pumping.

An example programming operation will be described here. When an address signal is entered from the address bus lab into the address buffer 51, the row decoder 56 and the column decoder 57 selects one memory cell or more out of the memory cell array 55. When programming data are entered from the data bus idb into the input/output circuit 52, the programming data are stored into the programming latch circuit 59 and connected to the memory cell to be programmed. The threshold voltage of the memory cell is raised by having the voltage generating circuit 50 raise a programming pulse generated by the timer 6 and applying the programming pulse to the selected memory cell. Now will be described the erasing operation. When an address signal is entered from the address bus iab into the address buffer 51, the row decoder 56 and the column decoder 57 select a plurality of memory cells out of the memory cell array 55. The threshold voltage of the memory cell is lowered by having the voltage generating circuit 50 raise an erase pulse generated by the timer 6 and applying the erase pulse to the selected. The timer 6 accurately controls the pulses of the programming and erase pulses, and programming and erasing operations are accomplished reliably even if there is any device unevenness among lots, wafers or chips or any temperature variation. Next will be described the reading operation. When an address signal is entered from the address bus iab into the address buffer 51, the row decoder 56 and the column decoder 57 select one memory cell or more out of the memory cell array 55. The level of the threshold voltage of the selected memory cell is detected with either the verify sense amplifier 9 of the read sense circuit 60, and the result is supplied to the data bus idb via the input/output circuit 52. The timing circuit 53 generates an internal timing signal for the flash memory on the basis of a strobe signal or a command (not shown) from outside. The delay circuit 4 is utilized for timing generation various internal timing signals. This delay circuit 4 accurately generates the timings, so that the timing of data reading and the like can be reliably controlled at high speed even if there is any device characteristic unevenness among lots, wafers or chips or any temperature variation.

In the example of FIG. 15, the memory means 13 is configured of a laser fuse circuit for programming control data and a latch circuit for latching the output of the laser fuse circuit, and the control data latched by the latch circuit are provided as datain to the control voltage generating circuit 10. The laser fuse circuit hold the control data according the mode in which a plurality of fuses are cut. This means that, once power supply is turned on, control data are supplied according the mode in which the fuses are cut. The output may be provided as it is to the control voltage generating circuit 10 all the time, but if the power consumption due to the permanent formation of a D.C. path in the laser fuse circuit is too great to ignore or if it is desired to facilitate the setting of control data when measurement is to be done using the external measuring terminal 3, it is preferable to provide the latch circuit. The latch circuit has only to be able to transfer control data from outside the flash memory via a test pad (not shown) or the input/output circuit 52.

The trimming technique for the constant current source is not limited to application to semiconductor devices, such as flash memories, but can be extensively applied to semiconductor devices having circuits dependent on the amperage of the current flowing in the MOS transistor, and can also be such memory LSIs as SRAMs and DRAMs.

Figure 16:
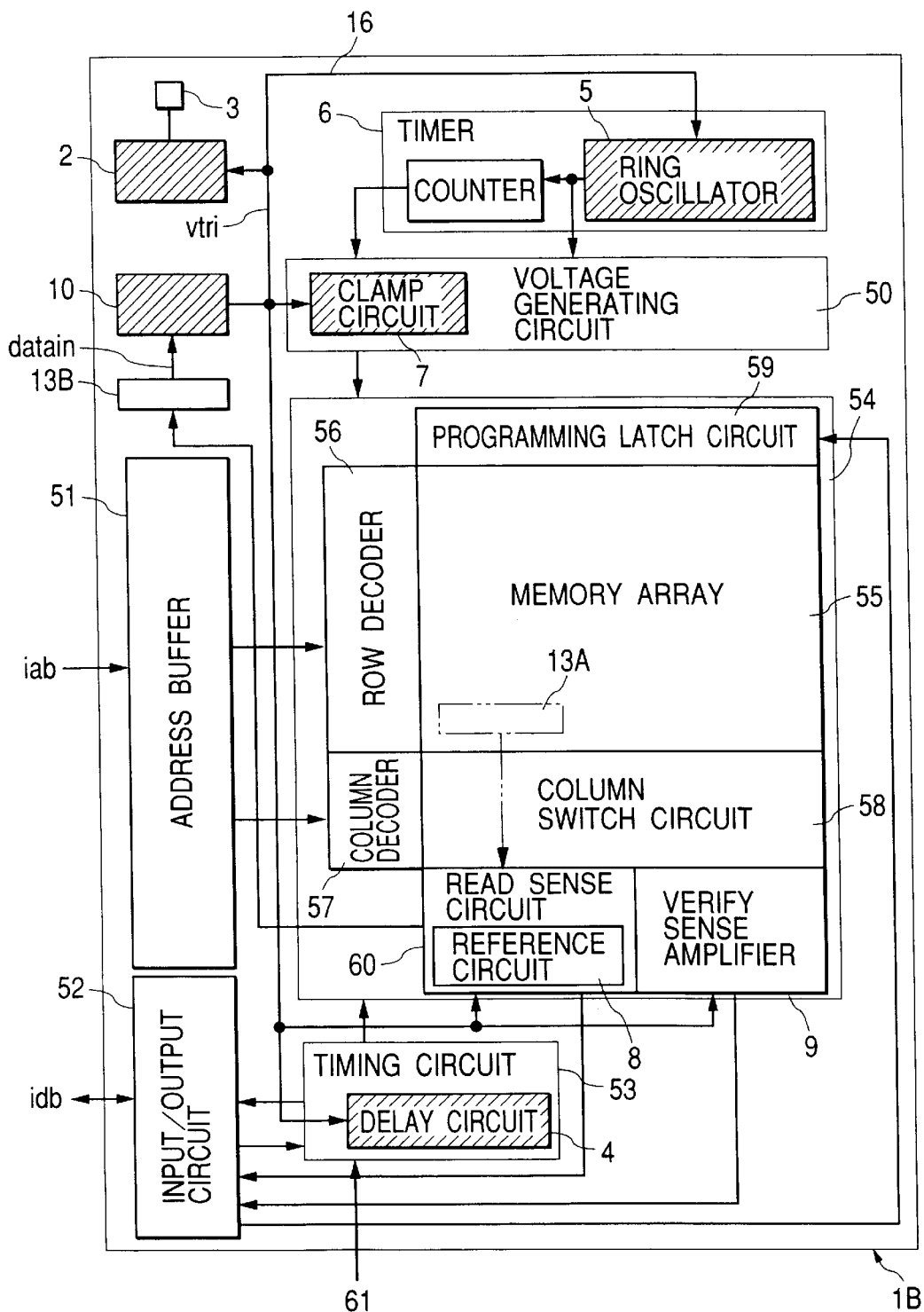
FIG. 16 is a block diagram illustrating another example of flash memory pertaining to the invention.

FIG. 16 illustrates another example of flash memory pertaining to the invention. The flash memory 1B shown in this drawing differs from the flash memory 1A of FIG. 15 in the configuration of the memory means. Thus the memory means in the configuration of FIG. 16 is configured of a partial memory area 13A of the memory cell array 55 and a register 13B for holding control data read out of the memory area 13A and providing them to the control voltage generating circuit 10. Further, an address is allocated to the register 13B, which is made write-accessible from an external bus idb via the input/output circuit 5. Where control data are to be set in the register 13B at the time of measurement using the external measuring terminal 3, desired control data can be written from outside via the input/output circuit 52. Therefore, at the time of measurement using the external measuring terminal 3, the trouble rewriting control data in the memory area 13A every time can be saved. When control data are to be read out of the memory area 13A in regular use after the completion of trimming, a specific strobe signal, such as a reset signal, may be given to the timing circuit 53, or a specific operating mode provided with a signal 61. When the initial load of control data is indicated with the signal 61, the timing circuit 53 instructs reading out of the memory area 13A in the memory cell array 55, and the read data read out of the memory area 13A are amplified by the read sense circuit 60 and internally transferred to the register 13B. As long as operational power is supplied to the flash memory 1B, the control data transferred to the register 13B are provided to the control voltage generating circuit 10 as datain, and the constant current source for the delay circuit 4 and others is set with the control voltage vtri thereby generated. The configuration in other respects is the same as that shown in FIG. 15, and therefore their detailed description is dispensed with.

FIG. 17 typically illustrates the programming state and the erase state of the flash memory cell. In FIG. 17, the flash memory cell has a source electrode 65 and a drain electrode 66 over a substrate (or a well region) 64, and is composed by vertically stacking over a channel region a floating gate electrode 67 and a control gate electrode 68 each via a gate insulating film.

Figure 17A:
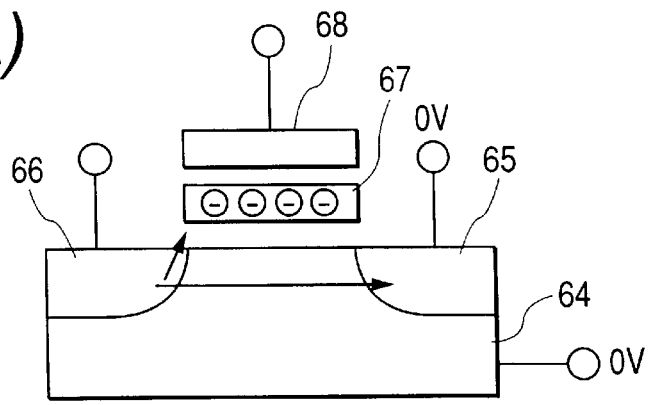
FIGS. 17A to 17C are diagrams illustrating how a voltage is applied in an action to program and an action to erase a flash memory cell, and threshold voltage distributions in the flash memory cell in the programming state and the erase state.
Figure 17B:
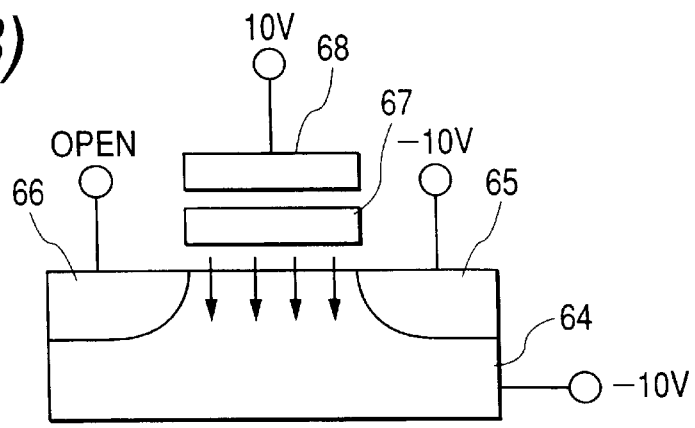
Figure 17C:
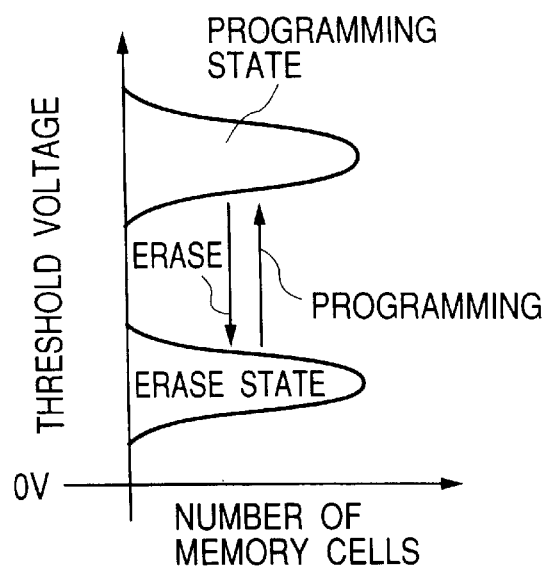

FIG. 17A illustrates programming. If, for instance, 10 V is applied to the control gate electrode 6, 5 V to the drain electrode 66 and 0 V to the source electrode 65 and the substrate 64, a current will flow between the drain and the source, hot electron injection takes place, the electrons are accumulated in the floating gate electrode 67, and the threshold voltage of the memory cell rises. FIG. 17B illustrates erasion. If, for instance, 10 V is applied to the control gate electrode 68 and −10 V, to the source electrode 65 and the substrate 64, and the drain electrode 66 is, for instance, placed in an open (floating) state, the electrons accumulated in the floating gate electrode 67 will be discharged to the substrate 64, and the threshold voltage of the memory cell will drop. FIG. 17C illustrates the distribution of the number of memory cells versus the threshold voltage of the flash memory cell, wherein a high threshold voltage state is the programming state and a low threshold voltage state, the erase state.

Figure 18:
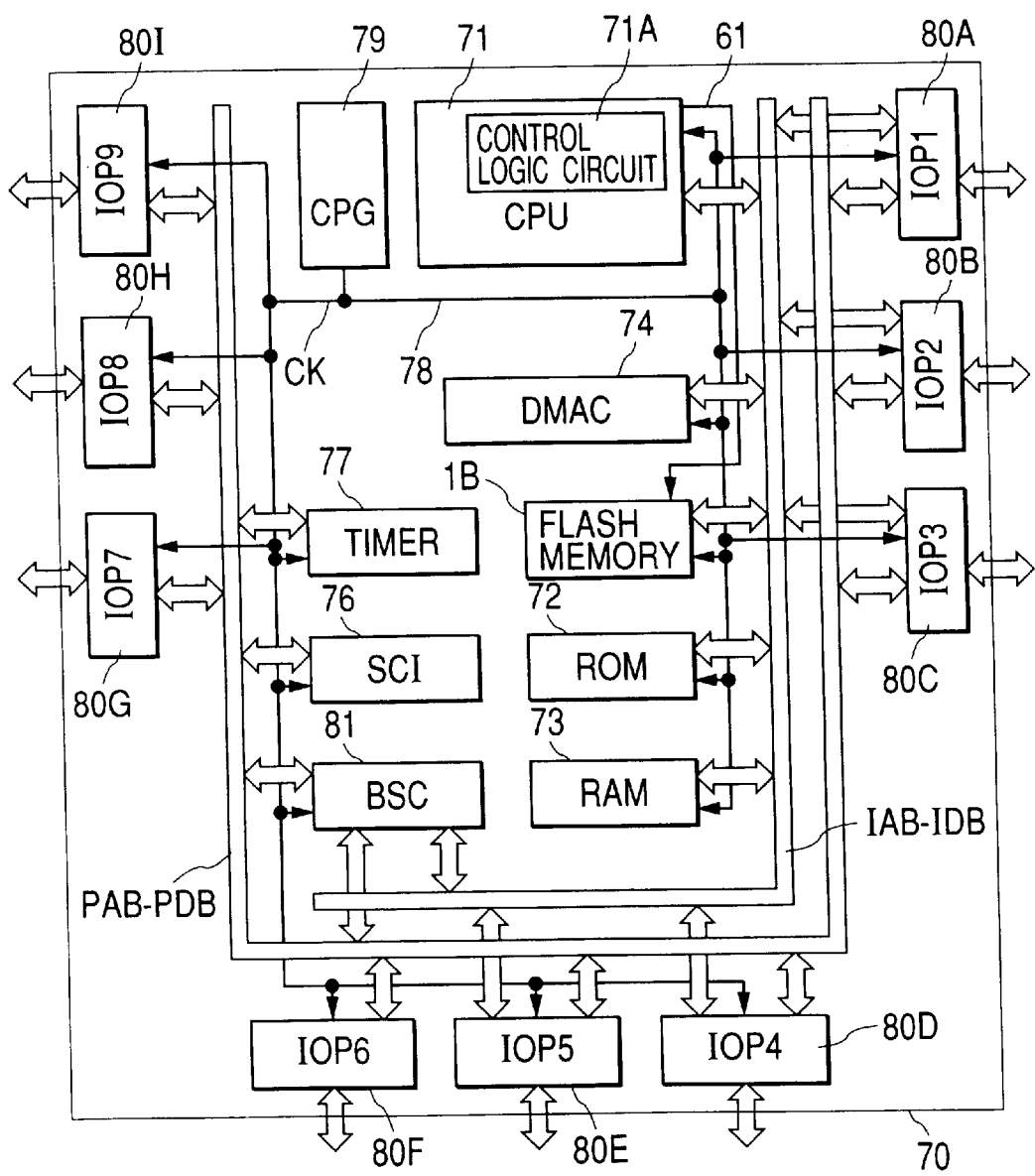
FIG. 18 is a block diagram illustrating an example of microcomputer pertaining to the invention.

FIG. 18 illustrates an example of microprocessor or microcomputer as a data processing apparatus pertaining to the present invention. This microcomputer is formed by applying, for instance, CMOS integrated circuit manufacturing technology to a single semiconductor substrate, such as monocrystalline silicon, and is provided with a flash memory on chip.

A microcomputer 70 has a central processing unit (CPU) 71, and a read only memory (ROM) 72 stores programs to be executed by the CPU 71 and fixed data. A random access memory (RAM) 73 stores the results of operation by the CPU 71 and provides a work area for the CPU 71. A direct memory access controller (DMAC) 74 performs control to transfer data between the ROM 72 or the RAM 73 and an external main memory (not shown) in units of a prescribed block each. The conditions of transfer control are initially set by the CPU 71, and the start of data transferring is instructed either by the CPU 71 or at a request from outside.

The microcomputer 70 has as its peripheral circuits a serial communication interface circuit (SCI) 76 for performing serial communication with external units, a timer 77 and a clock pulse generator (CPG) 79, having an oscillating circuit, for generating clocks CK on a clock line 78. It is connected to outside the chip via input/output ports (IOP1 through IOP9) 80A through 80I. In this microcomputer 70, the CPU 71, flash memory 1B, ROM 72, RAM 73, DMAC 74 and input/output ports (IOP1 through IOP5) 80A through 80E are connected to each other by main buses (a main address bus IAB and a main data bus IDB). There are further provided peripheral buses (a peripheral address PAB and a peripheral data bus PDB) for connecting peripheral circuits, such as the SCI 76 and the timer 77, and the input/output ports (IOP1 through IOP9) 80A through 80I. A bus sequence controller (BSC) 81 is further provided to control signal transfers between the main buses IAB and IDB and the peripheral buses PAB and PDB and to control the state of each bus.

In the on-chip flash memory 1B of the microcomputer 70 of FIG. 18, an instruction signal 61 for initially the control data from the memory area 13A onto the register 13B is supplied from a control logic 71A of the CPU 71. The control logic 71A, in response to an instruction of power-on reset or a reset instruction from outside with an external reset signal, activates the signal 61, and causes the flash memory 1B to initially load the control data onto the register 13B.

In the microcomputer 70 of FIG. 18, a circuit using the constant current source is not limited to the flash memory. Obviously, an on-chip module such as the ROM 72 or the RAM 73 may use a configuration similar to what was described with reference to FIG. 1, i.e. a configuration in which the constant current is observed externally to make trimming possible. In this case, where the circuit design is to be prepared module by module, each module being a flash memory or the like, each module may be provided with a circuit for the trimming purpose. Even in such a case, however, the external measuring terminal 3 can be commonly used by the on-chip modules via change-over switches of which one is provided for each module. Or where the unit of circuit design is a plurality of modules, a circuit for the trimming purpose can be commonly used for the plurality of on-chip modules. For a custom-designed semiconductor device, it would be easy to prepare an optimized design for the circuit for the trimming purpose.

Figure 19:
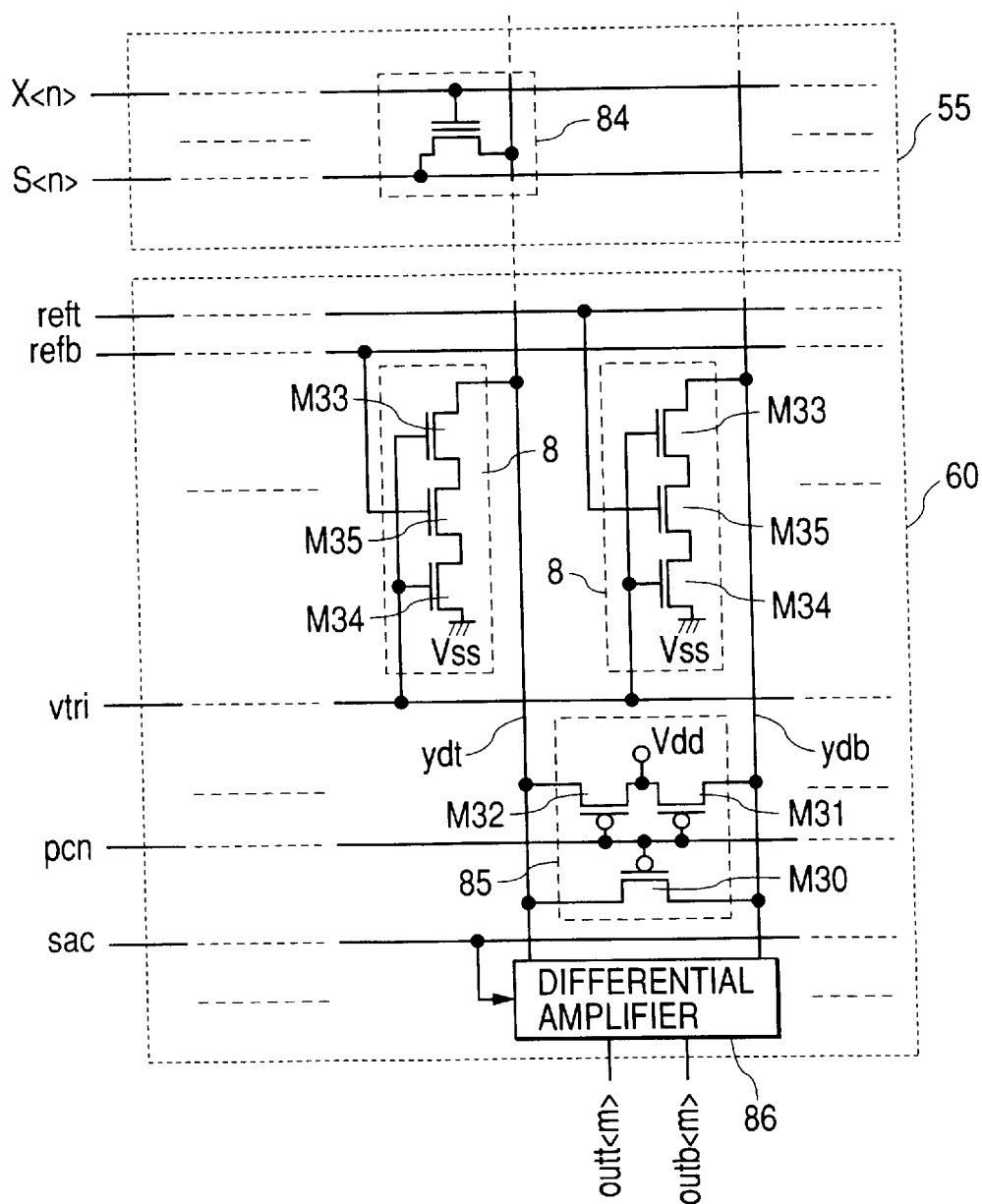
FIG. 19 is a circuit diagram typically illustrating details of a read sense circuit.

FIG. 19 illustrates details of the read sense circuit 60. In FIG. 19, reference numeral 55 denotes a memory cell array, which is represented by one flash memory cell 84 in the illustration, wherein x<n> denotes a word line; s<n>, a source line; and ydt and ydb, complementary bit lines. The read sense circuit 60 is provided with a reference circuit 8, a pre-charging circuit 85 and a differential amplifier 86 for each pair of complementary bit lines ydt and ydb.

The pre-charging circuit 85, consisting of an equalizing MOS transistor M30 and a pair of pre-charging MOS transistors M31 and M32, initializes the complementary bit lines ydt and ydb to the source voltage Vdd level as a pre-charging signal pcn is reduced to a low level in advance of reading. The differential amplifier 86 amplifies the potential difference between the complementary bit lines ydt and ydb, and differentially outputs read data outt<m> and outb<m>. Reference sign sac denotes an activation control signal for the differential amplifier 86.

Figure 20:
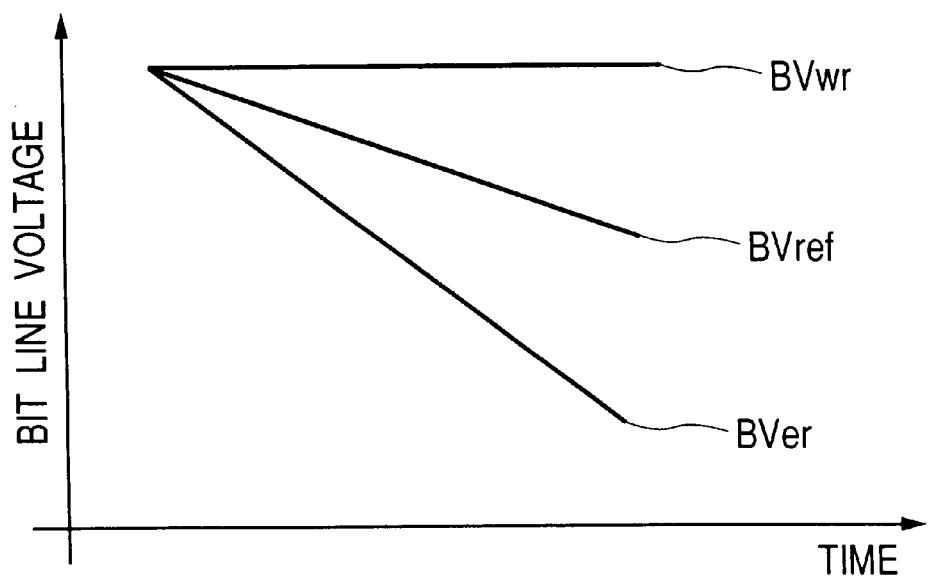
FIG. 20 illustrates the function of a reference circuit.

The reference circuit 8 makes flow a current for generating a reference potential of differential amplification by the differential amplifier 86. Essentially, when a word line is placed at a selection level, a flash memory cell in the programming state is turned off, and the bit line to which this cell is connected maintains the pre-charted potential, while a flash memory cell in the erase state is turned on and the bit line to which this cell is connected is discharged toward the grounding potential. To make this difference detectable by the differential amplifier 86 as a potential difference on bit lines, the reference circuit 8 is provided. The reference circuit 8 has a capability to discharge bit lines at a smaller mutual conductance than the mutual conductance of a flash memory cell which is on. As typically illustrated in FIG. 20, a potential variation (BVref) achieved on a bit line by a discharging action by the reference circuit 8 is set faster than a potential variation (BVwr) achieved on a bit line by a flash memory cell in the programming state of a high threshold voltage and slower than a potential variation (BVer) achieved on a bit line by a flash memory cell in the erase state of a low threshold voltage. Stored information can be determined from a voltage difference identified by this difference in potential variation.

The reference circuit 8 is configured of a serial circuit comprising two n-channel type constant current source MOS transistors M33 and M34 and an n-channel type switching MOS transistor M35 arranged between them, and the MOS transistors M33 and M34 are subjected to conductance control with the control voltage vtri. The switching MOS transistor M35 is subjected to switching control with complementary control signals reft and refb, and the switching MOS transistor M35 on the side of the bit line to which a flash memory cell selected with A word line is not connected is controlled to be turned on. When the memory cell 84 shown in FIG. 19 is to be selected, the switching MOS transistor M35 of the reference circuit 8 on the bit line ydb side is turned on. The MOS transistors M33 and M34 here are constant current source MOS transistors, and the amperages of the currents flowing therein are kept constant all the time by the application of the control voltage vtri determined by trimming data to the gate electrode. For this reason, read reference potentials generated via the reference circuit 8 are aligned to a prescribed potential even if there is any process unevenness, and the margins of read signals increase. This reference circuit 8 can be applied not only to flash memories but also to circuits using various memory cells permitting detection of stored information according to the amperage.

Figure 21:
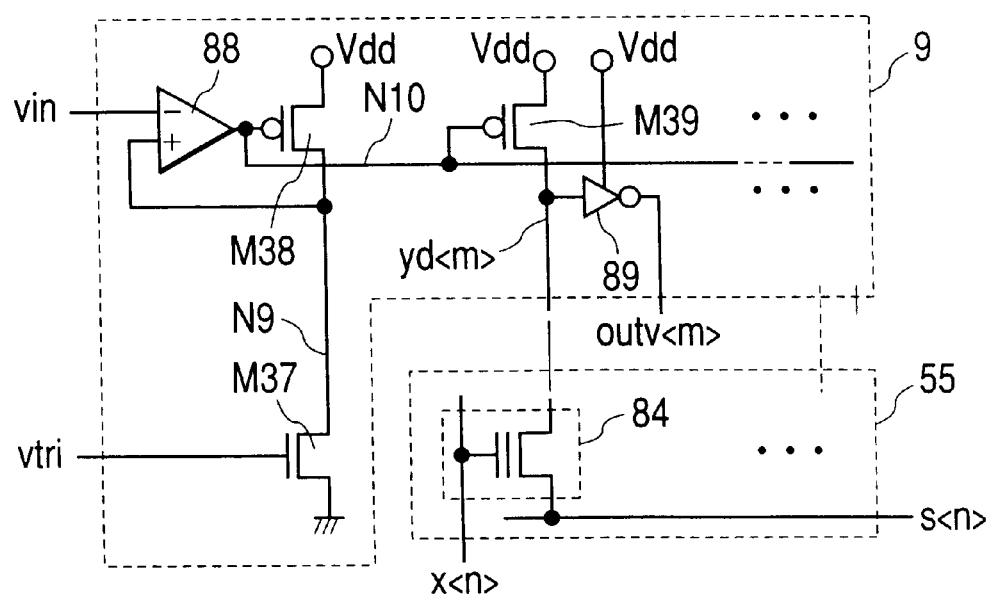
FIG. 21 is a circuit diagram typically illustrating details of a verify sense amplifier.

FIG. 21 illustrates details of the verify sense amplifier 9. In a read operation for verification, the potential of bit wiring yd<m> is determined according to the relative magnitudes of a current flowing in a p-channel type load MOS transistor M39 connected to the bit line yd<m> of the memory cell 84 and a current flowing in the memory cell 84, and the detection of that potential and its outputting to outv<m> by an inverter 89 results in verification of whether or not the threshold voltage of the memory cell 84 is at a desired level. Reference sign M37 here in FIG. 21 denotes an n-channel type constant current source MOS transistor. The application of the control voltage vtri determined by trimming data to the gate electrode can keep the amperage of the current flowing in the MOS transistor M37 substantially constant irrespective of any unevenness of device characteristics among lots, wafers or chips or any temperature variation. An operational amplifier 88 controls the gate potential of a p-channel type MOS transistor M38, i.e. the potential of a node N10 so as to equalize the potential of a node N9 to an input voltage vin. The input voltage vin may be, for instance, the logical threshold of the inverter 89 (e.g. 0.7 V), and under a boundary condition where outv<m> transitions from the "L" level to the "H" level, the states of M38, M37, M39 and the memory cell 84 are exactly equal. Therefore, if the voltage of the word line x<n> is set so as to free the current from temperature dependence at the desired threshold voltage of the memory cell 84, and the size of M37 is designed to be consistent with the amperage of the memory cell 84 then, it can be accurately checked whether or not the threshold voltage of the memory cell 84 is at its desired level. The circuit consisting of the operational amplifier 88, the MOS transistor M38 and the constant current source MOS transistor M37 constitutes a constant current source circuit for generating a constant voltage in the vicinity of the logic threshold voltage of the inverter 89. Although the memory cell in the foregoing description was a flash memory, it is not the only applicable memory cell, but the invention can also be applied to various other memory cells for detecting stored information according to the amperage.

Figure 22:
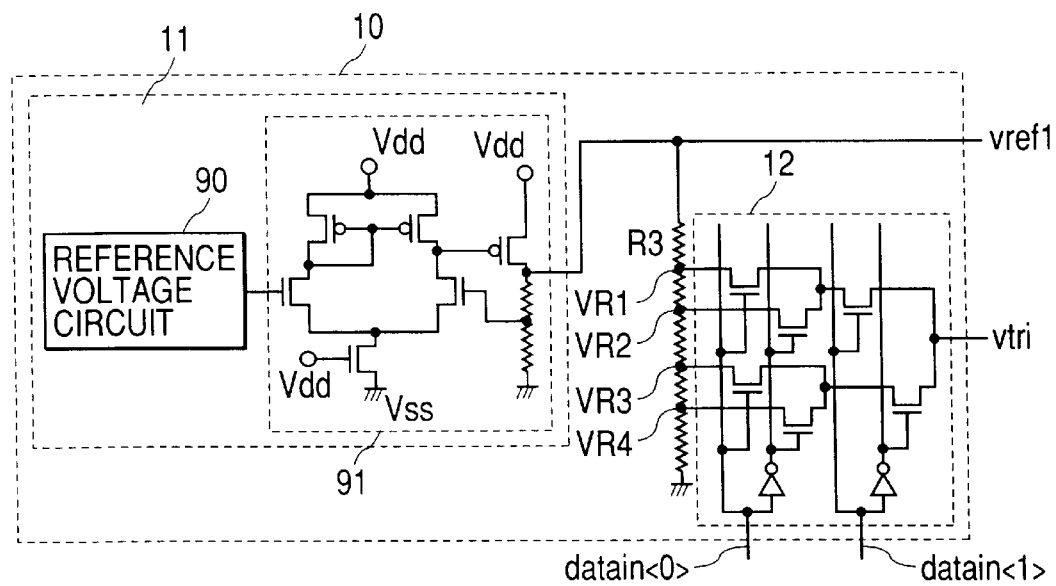
FIG. 22 is a circuit diagram typically illustrating details of a control voltage generating circuit.

FIG. 22 typically illustrates details of the control voltage generating circuit 10. The voltage generating circuit 11 is configured of a reference voltage circuit 90 for generating a reference voltage on the basis of a silicon band gap, a differential voltage between the threshold voltage of a p-channel type MOS transistor and the threshold voltage of an n-channel type MOS transistor or the like, and an amplifying circuit 91, and causes vref1 of a prescribed level to be generated. By connecting a resistor R3 to vref1 and connecting the point where the resistor R3 is divided to the switching circuit 12, one of voltages VR1, VR2, VR3 and VR4 can be selected according to, for instance, two-bit trimming data, i.e. signals datain<0> and datain<1>, and the selected voltage can be supplied as the control voltage vtri. The trimming data are not limited to a two-bit configuration but may have more multiple bits. In this case, according to the vtri voltage generating technique by resistance division, a multi-bit configuration can be readily realized, and moreover the vtri level can be finely adjusted, so that the current of the replica MOS transistor 2 can be adjusted with high accuracy at the time of trimming. Thus there is the advantage of making it possible to realize a highly accurate constant current source MOS transistor and accordingly a circuit using a constant current source MOS transistor hardly susceptible to unevenness in circuit characteristics. To add, vref1 is often used as the reference potential for other circuits. In such a case, the usual practice is to accomplish voltage trimming to set the vref1 level to another desired voltage than the current trimming according to the invention. For instance, the voltage trimming circuit, though not illustrated in FIG. 22, may make the resistance dividing point for extracting a voltage vref1 from the amplifying circuit 91 selectable according to voltage control data. A specific example of voltage trimming will be described afterwards. If the voltage trimming is done after the current trimming described with reference to FIG. 1, the level of vtri will vary and the current of the constant current source MOS transistor will deviate from the desired amperage. Therefore, current trimming should be done after the voltage trimming.

Figure 23:
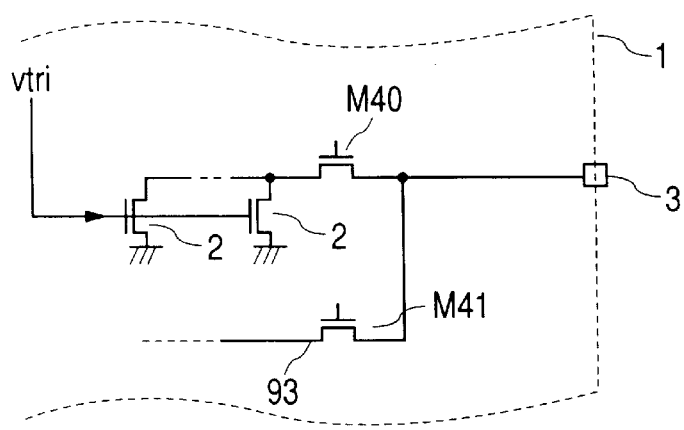
FIG. 23 is a diagram illustrating an example of the use of the external measuring terminal for dual purposes.

FIG. 23 illustrating an example of the use of the external measuring terminal 3 for dual purposes. A switching MOS transistor M40 is arranged between the replica MOS transistor 2 and the external measuring terminal 3, and another signal line 93 is connected between this switching MOS transistor M40 and the external measuring terminal 3 via another switching MOS transistor M41. Although the switching MOS transistors M40 and M41 are illustrated to be one MOS transistor each, each is actually configured in a number or size necessary for transmitting the required quantity of signals. Control signals for the switching MOS transistors M40 and M41 can be entered from a test pad (not shown) or via an on-chip test logic.

Figure 24:
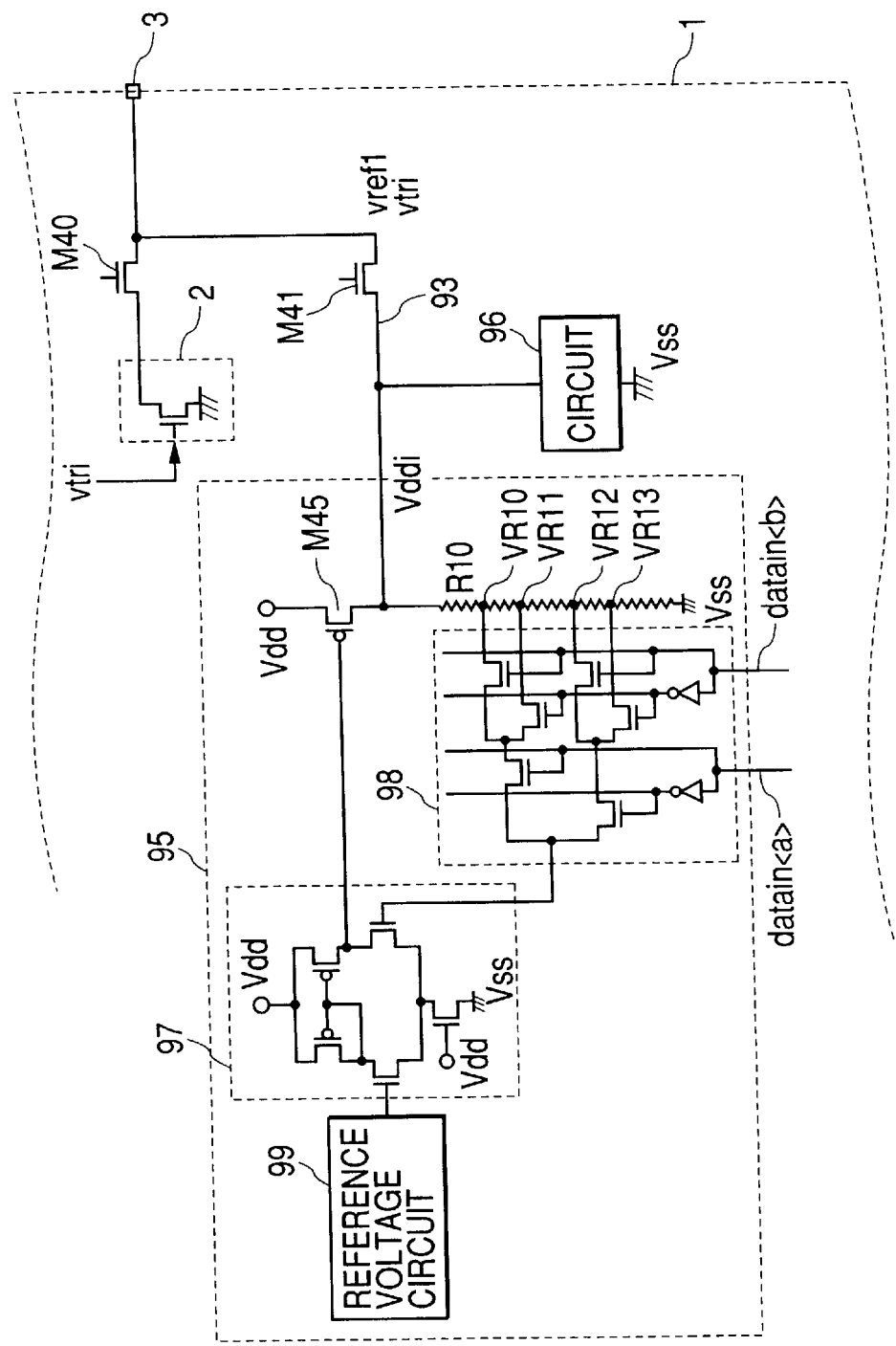
FIG. 24 is a circuit diagram typically illustrating details of a voltage trimming circuit capable of trimming by using an external measuring terminal.

FIG. 24 illustrates an example of voltage trimming circuit capable of trimming by using the external measuring terminal 3. To the signal line 93 are connected a voltage generating circuit 95 and a load circuit 96 of that voltage generating circuit 95. The voltage generating circuit 95 consists of a reference voltage circuit 99 for generating a reference voltage on the basis of a silicon band gap, a differential voltage between the threshold voltage of a p-channel type MOS transistor and the threshold voltage of an n-channel type MOS transistor or the like, an amplifying circuit 97, a switching circuit 98, a driver MOS transistor M45 and a resistor R10. The voltage generating circuit 95 generates a voltage Vddi at the coupling point between the driver MOS transistor M45 and the resistor R10, and provides this voltage to the load circuit 96 as the operating power source.

The switching circuit 98, connected to mutually differing voltage dividing points of the resistor R10, can select one out of voltages VR10, VR11, VR12 and VR13 according to, for instance two-bit trimming data, i.e. datain<a> and datain<b>, and feeds back the selected voltage to the amplifying circuit 97 to make the voltage Vdii regulable and to make the regulated voltage constant. To facilitate observation of the voltage Vddi to regulate the output voltage Vddi to a prescribed level, the signal line 93 is made connectable to the external measuring terminal 3 via the switching MOS transistor M41. The trimming data are not limited to a two-bit configuration but may have more multiple bits. The circuit that requires voltage trimming is not limited to the voltage generating circuit, and a plurality of circuits may be connected to the external measuring terminal 3 via the switching MOS transistor M41. Furthermore, the reference voltage circuit 99 may be concurrently used as the reference voltage circuit 90 of FIG. 22.

Figure 25A:
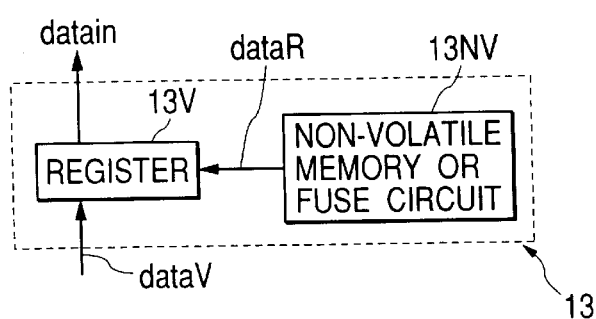
FIGS. 25A and 25B are diagrams illustrating in a patronized way forms of the memory means for holding control data.
Figure 25B:
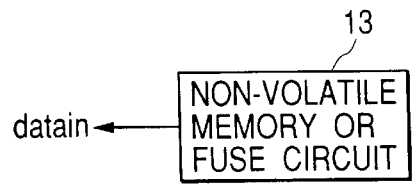

FIG. 25 illustrating in a patronized way forms of the memory means 13 of FIG. 1. Referring to FIG. 25A, the memory means 13 is configured of a non-volatile memory means 13NV and a volatile memory means 13V. The non-volatile memory means 13NV is, for instance, an electrically rewritable non-volatile memory such as a flash memory, or a fuse circuit whose stored information cannot be altered once programmed. The volatile memory means 13V is a register using a static latch or the like. The volatile memory means 13V can temporarily store trimming data. Therefore, instead of writing trimming data into or programming the non-volatile memory means 13NV which may be a non-volatile memory which is slow to write into or a fuse circuit permitting writing into only once, the optimal trimming data, i.e. data to give a desired amperage to the current of the replica MOS transistor 2, can be determined by altering from outside the trimming data dataV supplied to the volatile memory means 13V which may be a register. As a result, the test time can be shortened. The trimming data dataR finalized in this manner are written into the non-volatile memory means 13NV, which may be a non-volatile memory or a fuse circuit, or programmed, and initially loaded onto the volatile memory means 13V in response to power supply actuation or a reset instruction. Referring to FIG. 25B, the non-volatile memory means 13 is configured solely of a non-volatile memory means, which may be an electrically rewritable non-volatile memory such as a flash memory, or a fuse circuit whose stored information cannot be altered once programmed.

Figure 26:
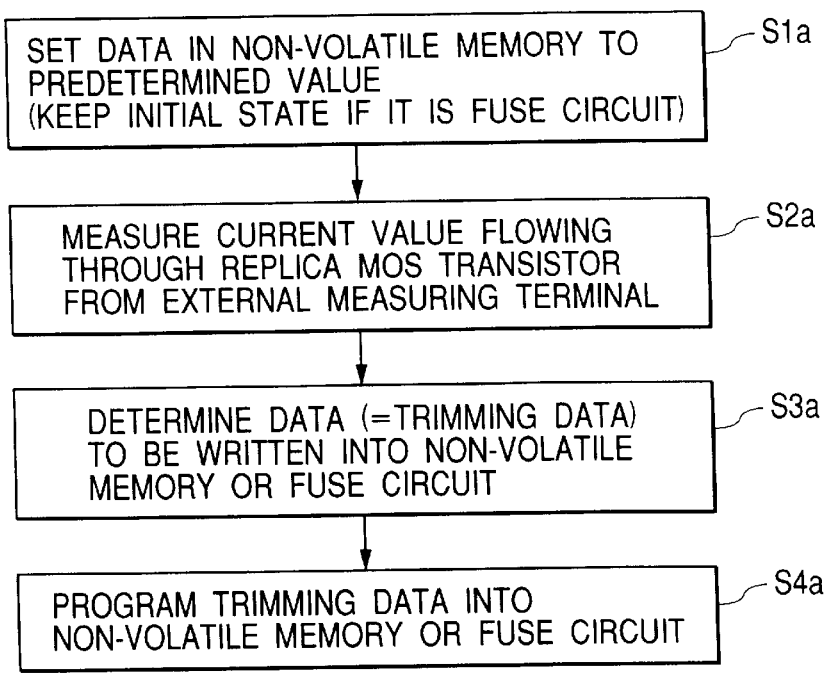
FIG. 26 is a flow chart showing a typical procedure of trimming by using the memory means of FIG. 25B.

FIG. 26 shows a typical procedure of trimming by using the memory means of FIG. 25B. First, where a non-volatile memory is used as the non-volatile memory means 13, data in the non-volatile memory are set to a prescribed value. Where a fuse circuit is used as the non-volatile memory means 13, the initial state is left as it is (S1a). Then, the amperage of the current flowing from the external measuring terminal 3 the replica MOS transistor 2 is measured (S2a). Next, according to the measured result, trimming data to give a desired amperage to the current of the replica MOS transistor 2 are determined on the basis of a table or a prescribed calculation formula (S3a). Finally, the determined trimming data are written into the non-volatile memory or fuse circuit 13 (S4a). After that, it may be confirmed that the current of the replica MOS transistor 2 has the desired amperage.

Figure 27:
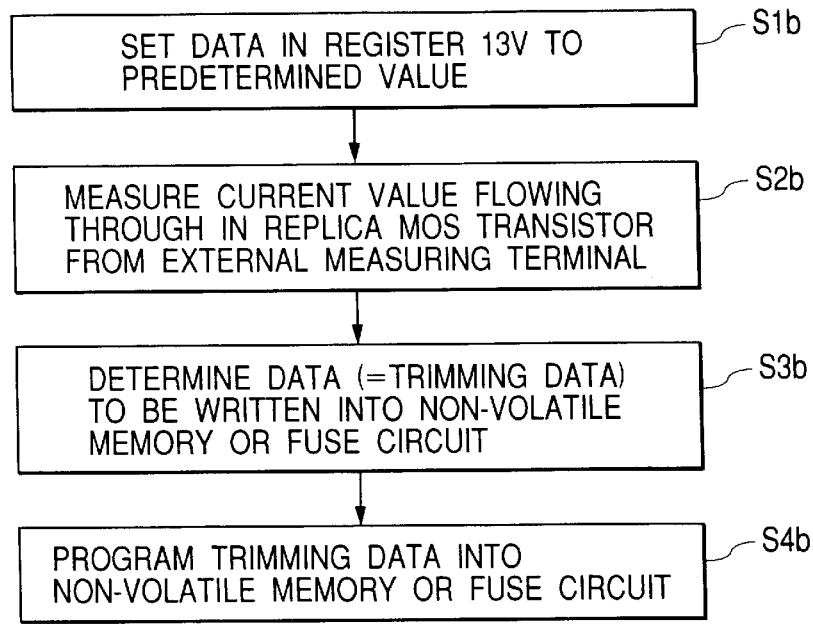
FIG. 27 is a flow chart showing a typical procedure of trimming by using the memory means of FIG. 25A.

FIG. 27 shows a typical procedure of trimming by using the memory means of FIG. 25A. First, data in the register 13V are set to a prescribed value (S1b). Then, the amperage of the current flowing in the replica MOS transistor 2 is measured from the external measuring terminal 3 (S2b). Next, according to the measured result, trimming data to give a desired amperage to the current of the replica MOS transistor 2 are determined (S3b). Then, the determined trimming data are written into the non-volatile memory or fuse circuit 13NV (S4b). After that, it may be confirmed that the current of the replica MOS transistor 2 has the desired amperage.

Figure 28:
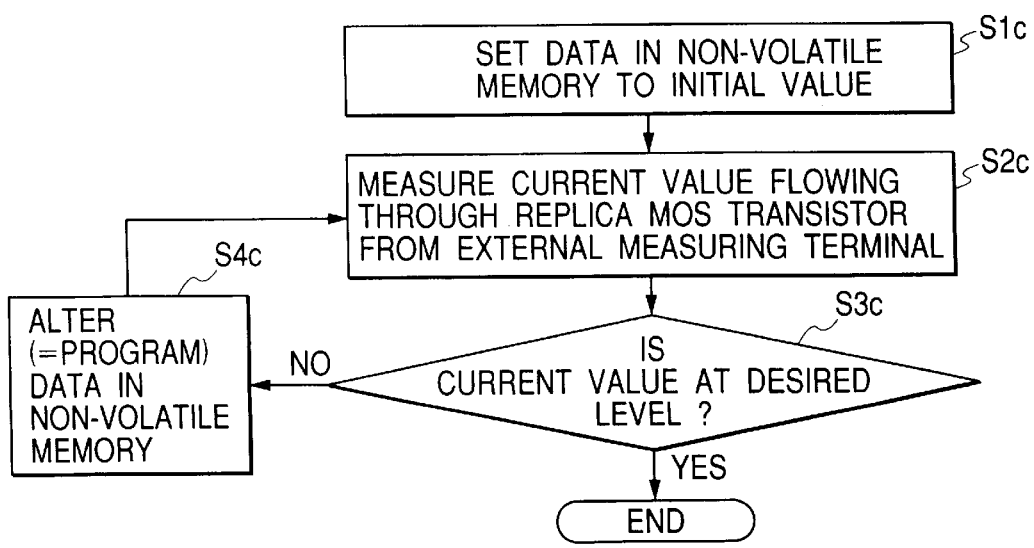
FIG. 28 is a flow chart showing another typical procedure of trimming by using the memory means of FIG. 25B.

FIG. 28 shows another typical procedure of trimming by using the memory means of FIG. 25B. This applies only to a case in which a non-volatile memory is used as the non-volatile memory means 13NV. First, data in the non-volatile memory 13NV are set to an initial value (S1c). Then, the amperage of the current flowing in the replica MOS transistor 2 is measured from the external measuring terminal 3 (S2c). Next, it is checked whether or not the measured result is the desired value (S3c) and, if not, data in the non-volatile memory 13NV are altered (S4c), followed by the measurement again of the amperage of the current flowing in the replica MOS transistor 2 from the external measuring terminal 3 (S2c). These steps are repeated successively, and trimming is completed when the measured value is found the same as the desired value. The desired value in this context means a value within the tolerance anticipated from the voltage gradation of vtri determined by the number into which the resistor R3 of FIG. 22 is divided, for instance. Or starting with the lowest level as the initial value of the non-volatile memory 13NV, the data can be varied in the direction in which the amperage of the replica MOS transistor 2 successively increases, and trimming can be completed when the amperage of the replica MOS transistor 2 has surpassed the desired value.

Figure 29:
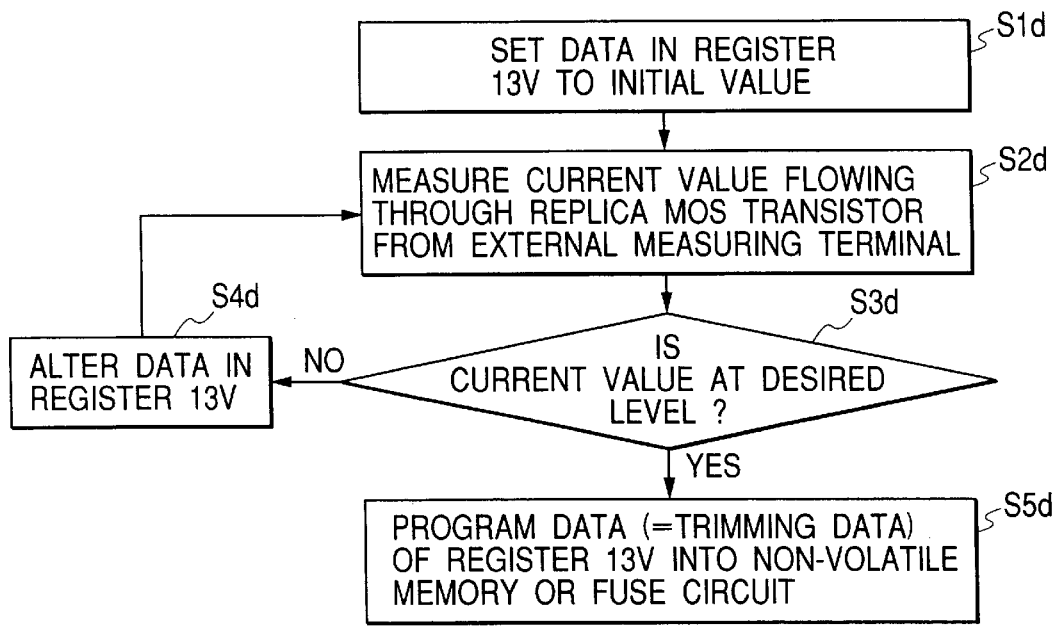
FIG. 29 is a flow chart showing another typical procedure of trimming by using the memory means of FIG. 25A.

FIG. 29 shows another typical procedure of trimming by using the memory means of FIG. 25A. First, data in the register 13V are set to an initial value (S1d). Then, the amperage of the current flowing in the replica MOS transistor 2 is measured from the external measuring terminal 3 (S2d). Next, it is checked whether or not the measured result is the desired value (S3d) and, if not, data in the register 13V are altered (S4d), followed by the measurement again of the amperage of the current flowing in the replica MOS transistor 2 from the external measuring terminal 3 (S2d) These steps are repeated successively, and data in the register 13V, i.e. the trimming data are written into the non-volatile memory or fuse circuit 13NV is completed when the measured value is found the same as the desired value (S5d).

Figure 30A:
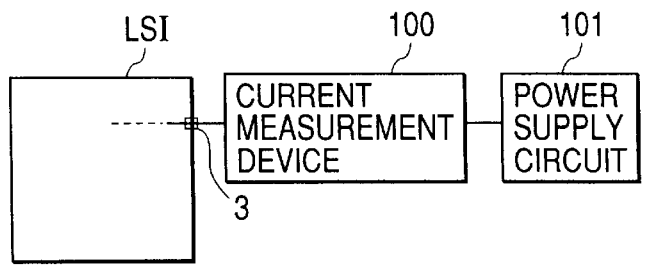
FIGS. 30A and 30B are diagrams typically illustrating how the amperage of the replica MOS transistor is measured in the trimming procedure.
Figure 30B:
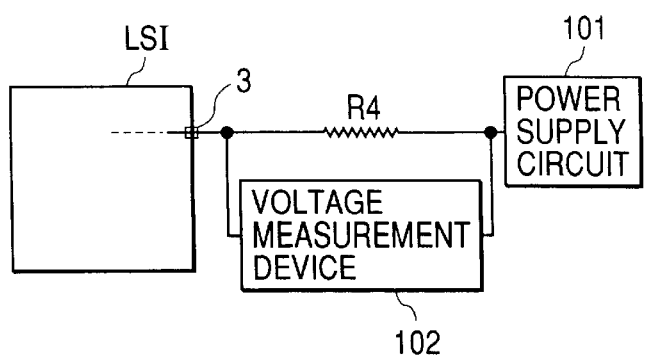

FIG. 30 typically illustrates how the amperage of the replica MOS transistor 2 is measured in the trimming procedure. Referring to FIG. 30, LSI denotes a semiconductor device pertaining to the present invention, such as a semiconductor apparatus, a microcomputer or a flash memory. Referring to FIG. 30A, a current measurement device and a power supply circuit 101 are connected in series to the external measuring terminal 3, and the amperage of the current flowing in the replica MOS transistor 2 is measured with the current measurement device. Referring to FIG. 30B, an outside resistor R4 whose resistance level is known and the power supply circuit 101 are connected in series to the external measuring terminal 3, and a voltage measurement device 102 is connected in parallel to the resistor R4. As the resistance of the resistor R4 is, known, the amperage of the current flowing in the replica MOS transistor 12 can be converted into a voltage in accordance with Ohm's law, and that voltage is measured with the voltage measurement device 102. Alternatively, the current measurement device or the voltage measurement device 102 may be configured of a MOS transistor, with a semiconductor device LSI according to the invention built into it, and can be used for measuring the amperage of the current flowing in the replica MOS transistor 2. This makes possible automatic execution of the trimming procedures charted in FIG. 26 through FIG. 29 within the semiconductor device LSI according to the invention.

Figure 31A:
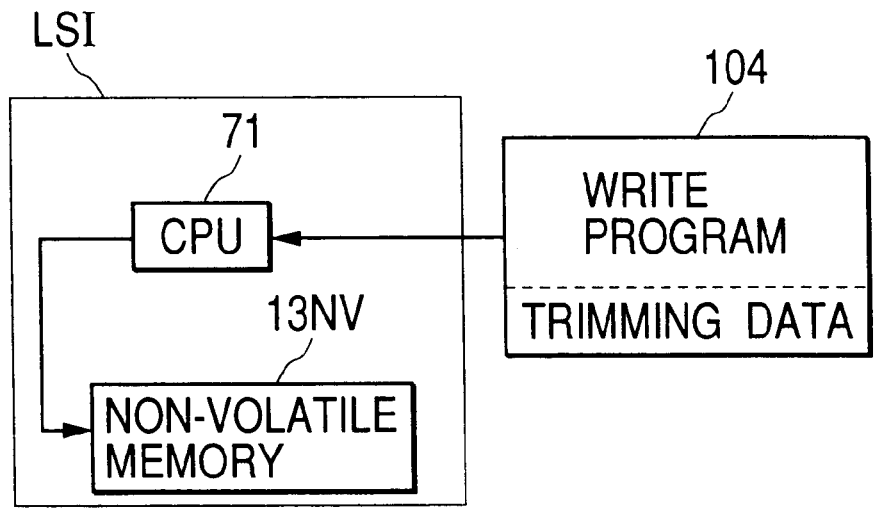
FIGS. 31A and 31B are diagrams typically illustrating how trimming data are written into a non-volatile memory in the trimming procedure.
Figure 31B:
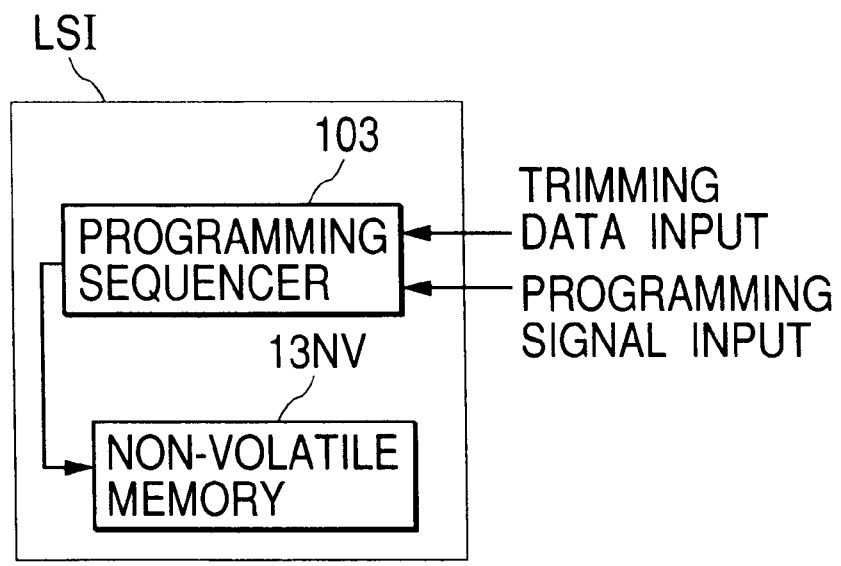

FIG. 31 typically illustrates how trimming data are written into the non-volatile memory 13NV in the trimming procedure. FIG. 31A shows a case in which the CPU 71 is built into the semiconductor device LSI. In this case, trimming data are incorporated into a write program 104 and transferred to the CPU 71 via a serial interface or the like, and the CPU 71 is caused to execute the write program 104. The CPU 71 is thereby enabled to write the trimming data into the non-volatile memory 13NV. FIG. 31B shows a case in which a programming sequencer 103 is built into the semiconductor device LSI. In this case, by entering trimming data and a programming signal from an external writing device, such as an EPROM writer into the programming sequencer 103, the programming sequencer 103 is enabled to write the trimming data into the non-volatile memory 13NV. The CPU 71 and the programming sequencer 103 in FIGS. 31A and 31B, respectively, need not be built into the semiconductor device LSI, and if not, an external CPU or programming sequencer can be connected to the semiconductor device LSI, and the write program 104 or trimming data and the programming signal can be transferred to or entered into the CPU or programming sequencer outside the semiconductor device LSI. Though not illustrated, where a fuse circuit is used, trimming data are written by cutting the fuse in a required position with a laser.

Figure 32:
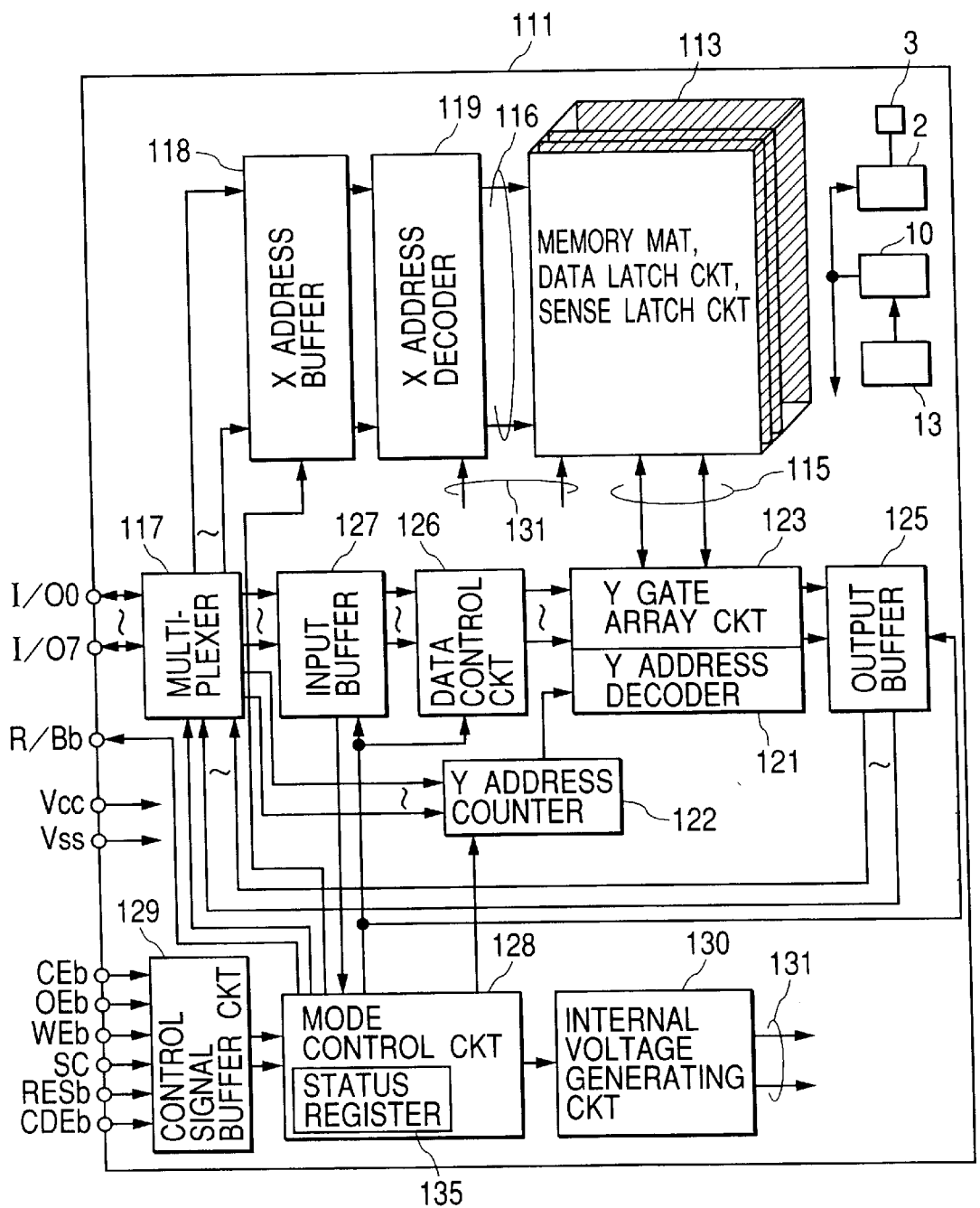
FIG. 32 is a block diagram illustrating an example of multi-value flash memory to which the invention is applied.

FIG. 32 illustrates a multi-value flash memory as another example of flash memory. The multi-value flash memory is a flash memory of which a single non-volatile memory element can be caused to hold more than two-bit stored information. Thus the single non-volatile memory element is a memory in which information stored in a single non-volatile memory element is in the form of multi-bit data. This element, when storing information, is set to one of four or more threshold voltages designated by multi-bit programming data and, when reading out information, supplies the state of the threshold voltage as corresponding multi-bit stored information. Referring to FIG. 32, a flash memory 111 in which two-bit information can be written into and read out of a single memory cell will be described.

Reference numeral 113 denotes a memory section having a plurality of memory mats, data latch circuits and sense latch circuits. The memory mats have a large number of electrically erasable and writable flash memory cells. Each flash memory cell may, though not absolutely need to, a source electrode, a drain electrode, a floating gate electrode and a control gate electrode as described above, wherein the control gate electrode is connected to a word line 116, the drain electrode to a bit line 115, and the source electrode to a source line (not shown).

External input/output terminals I/O0 through I/O7 are concurrently used as address input terminals, data input terminals, data input terminals and command input terminals. X address signals entered from the external input/output terminals I/O0 through I/O7 are supplied to an X address buffer 118 via a multiplexer 117. An X address decoder 119 decodes an internal complementary address signal supplied from the X address buffer 118, and drives word lines.

At one end of the bit line 115 are provided sense latch circuits (not shown) and at the other end are provided data latch circuits (not shown either). The bit line 115 is selected by a Y gate array circuit (column switch circuit) 123 on the basis of a selection signal supplied from a Y address decoder 121. Y address signals entered from the external input/output terminals I/O0 through I/O7 are preset in a Y address counter 122, and address signals successively incremented starting the preset value are provided to the Y address decoder 121.

The bit line selected by the Y gate array circuit 123 communicates to the input terminal of the output buffer 125 during an operation to output data, and to the output terminal of the input buffer 127 via a data control circuit 126 during an operation to input data. Connection among the output buffer 125, the input buffer 127 and the input/output terminals I/O0 through I/O7 are controlled by the multiplexer 117. Commands supplied from the input/output terminals I/O0 through I/O7 are provided to a mode control circuit 128 via the multiplexer 117 and the input buffer 127. The data control circuit 126 enables data of logical values subjected to control by the mode control circuit 128, in addition to data supplied from the input/output terminals I/O0 through I/O7, to be supplied to the memory section 113.

A control signal buffer circuit 129 is supplied with a chip enable signal CEb, an output enable signal OEb, a write enable signal WEb, a serial clock signal SC, a reset signal RESb and a command enable signal CDEb as access control signals. The mode control circuit 128 control signal functions of signal interfacing with outside and the like in accordance with the states of those signals, and controls internal operations in accordance with command codes. When a command or data are to be entered into the input/output terminals I/O0 through I/O7, the signal CDEb is asserted. If a command is to be entered, the signal Web is further asserted, or if data are to be entered, Web is negated. If it is an address input, the signal CDEb is negated, and the signal Web is asserted. This enables the mode control circuit 128 to distinguish among commands, data and addresses entered from the external input/output terminals I/O0 through I/O7 in a multiplexed form. The mode control circuit 128 can assert a ready/busy signal R/Bb during an erase or programming action to make known its state to the outside.

An internal voltage generating circuit 130 generates various operational voltages 131 for programming, erase, verify and read, and supply them to the X address decoder 119 and the memory section 113.

The mode control circuit 128 exercises overall control on the flash memory 111 in accordance with commands. The operation of the flash memory 111 is basically determined by a command. Commands allocated for the flash memory 111 include a read command, an erase command and a programming command.

The flash memory 111 has a status register 180 to indicate its internal status, and its contents can be read out of the input/output terminals I/O0 through I/O7 by asserting the signal Oeb.

Figure 33:
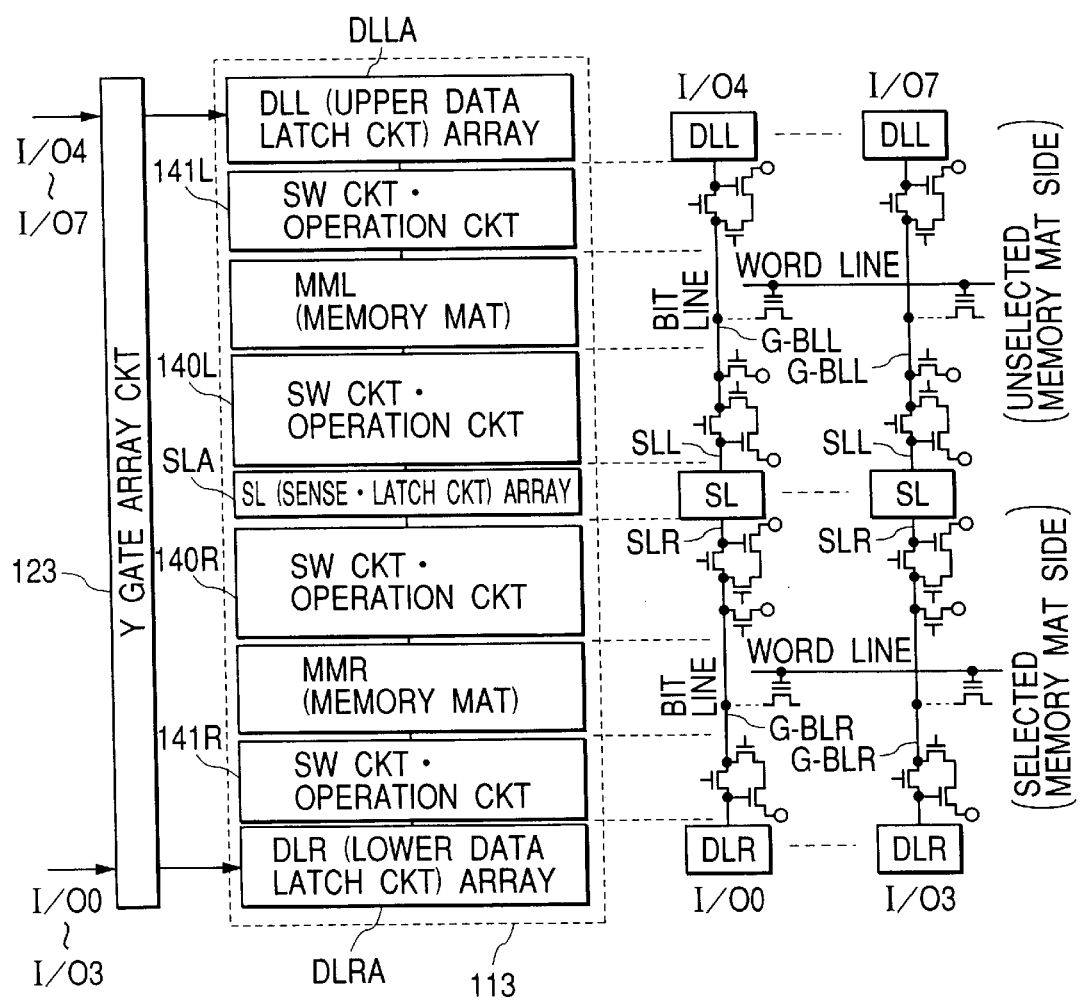
FIG. 33 is a block diagram illustrating the relationship between a data latch circuit and a sense latch circuit contained in the memory section of the multi-value flash memory.

FIG. 33 illustrates the relationship between the data latch circuits and the sense latch circuits contained in the memory section 113. An array SLA of sense latch circuits SL are arranged in the middle, and on one input/output node side of the sense latch circuits SL are provided an SW circuit and operation circuit array 140L, memory mats MML, an SW circuit and operation circuit array 141L and an array DLLA of upper data latch circuits DLL. Similarly, on the other input/output node side are arranged an SW circuit and operation circuit array 140R, memory mats MMR, an SW circuit and operation circuit array LX and an array DLR of lower data latch circuits DLR.

Figures 34, 35:
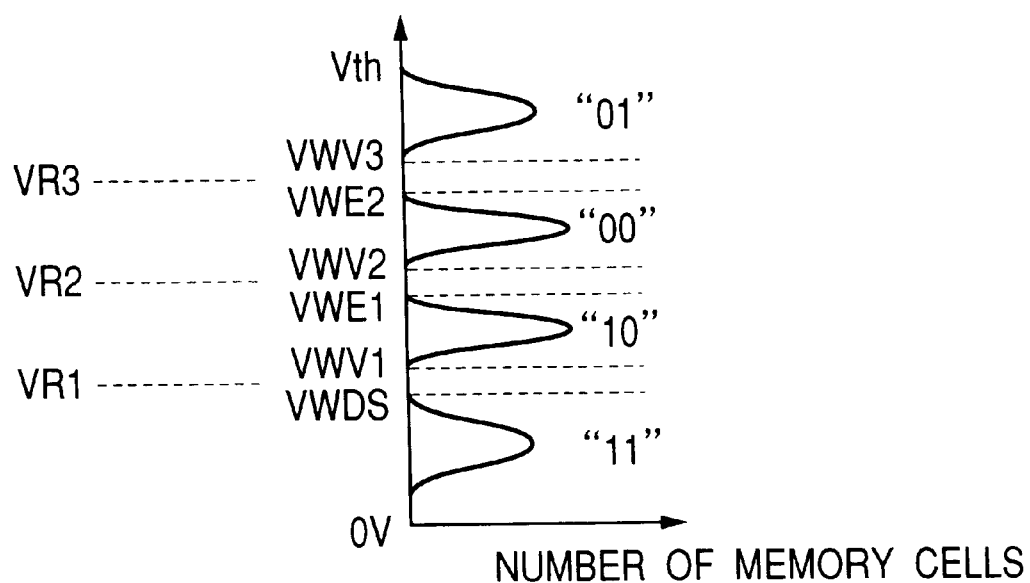
FIG. 34 is a table showing an example of data setting in which data latch on the selected memory mat side and data latch on the unselected memory mat side are matched with data input/output terminals.
FIG. 35 is a threshold voltage distribution diagram showing the relationship between the two-bit stored data in the flash memory cell and the threshold voltage.

As shown in FIG. 33, to understand its configuration by focusing on a pair of bit lines, data latch circuits DLL and DLR are provided on a pair of data input/output nodes SLL and SLR of a sense latch circuit SL in a static latch form via bit lines G-BLL and G-BLR. The data latch circuits DLL and DLR can latch programming data bits via the Y gate array circuit 123. According to this example, as the flash memory 111 has the eight-bit input/output terminals I/O0 through I/O7, it can set programming data on the data latch circuits DLL and DLR of four pairs of bit lines by-one programming data input action. The mode of data setting may be, though not absolutely needs to be, such that programming data from the data input/output terminal I/O0 through I/O3 for the four lower bits are set in the data latch circuit of the selected memory mat side, and programming data from the data input/output terminal I/O4 through I/O7 for the four upper are set in the data latch circuit of the unselected memory mat side. FIG. 33 shows an example in which the memory mats MMR are memory mats on the selected side regarding the matching of programming data setting. FIG. 34 shows an example of data setting in which, the memory mats MMR being memory mats on the selected side, the data latch circuit DLR on the side of the selected memory mats MMR and the data latch circuit DLL on the side of the unselected memory mats MML are matched with the data input/output terminal I/O0 and I/O4, respectively. As the description here supposes programming in units of a word line each, programming by the application of a programming voltage takes place after programming data have been set in the data latch circuits DLL and DLR regarding the bit lines of all the memory cells whose selection terminals are coupled with one word line.

The selection of memory mats may be, though not absolutely need to be, determined by the logical value of the most significant bit of the X address signal.

The data control circuit 126 for controlling the connection of the mode control circuit 128, the I/O terminals, the data latch circuits and the like constitute the control means for the flash memory 111. This control means divides multi-bit programming data between the data latch circuits on the first memory mat side and those on the second the memory mat side on the basis of information to designate the memory mat of write destination, and have them hold the data on a shared basis. The control means, on the basis of programming data held by data latch circuits on both the first memory mat side and the second memory mat side, causes control information (programming control information) to determine the threshold voltage state of the non-volatile memory cell on a memory mat to be computed by the pre-charging circuit and the sense latch circuit at every time of threshold voltage setting, and further causes the information to be latched by the sense latch circuit.

In the multi-bit information storage technique to be realized with the flash memory 111 shown in FIG. 32, the information storage state of one memory cell is selected out of the erase state ("11"), first programming state ("10"), second programming state ("00") and third programming state ("01"). The total of four different information storage states are supposed to be determined by two-bit data. Thus, two-bit data are stored in a single memory cell. The relation between these four-value data and threshold voltages are shown in the threshold voltage distribution diagram of FIG. 35.

In order to achieve a threshold voltage distribution as shown in FIG. 35, three different programming verify voltages should be set for application to word lines at the time of programming, and switched over successively to divided the programming operation into three phases. In FIG. 35, VWV1, VWV2 and VWV3 are programming verify voltages for use in the first programming state, second programming state and third programming state, respectively.

Figure 36:
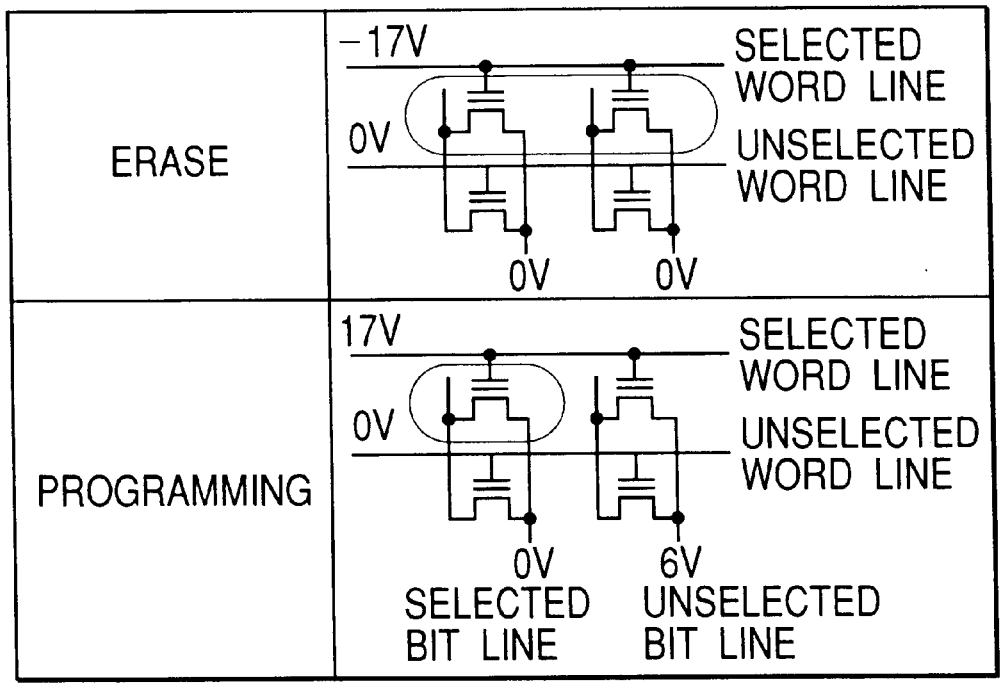
FIG. 36 is a diagram illustrating an example of voltage applying conditions for programming and erasion.

One example of the state of voltage application to word lines and bit lines in an individual action in the three-phased programming procedure is shown in FIG. 36. To a bit line selected for programming is applied 0 V and to an unselected bit line, 6 V. The voltage for a word line may be, though not absolutely need to be, 17 V for instance. The longer the duration of the high voltage application for programming, the higher the threshold voltage of the memory cell. The control of the three programming threshold voltages can be accomplished by the duration control in the high voltage state and by the level regulation of the high voltage applied to the word line.

Whether to apply 0 V or 6 V to the bit line is determined by the logical value of the programming control information to be latched by the sense latch circuit SL. Latch data of the sense latch circuit is so controlled that programming is not selected at a logical value of "1" on the memory mat side selected for programming, and programming is selected at a logical value of "0".

The latch action for the programming control information on the sense latch circuit is taken in each phase of the programming operation divided into three phases. This programming control is carried out by the mode control circuit 128. The programming control information to be latched by the sense latch circuit SL then is generated by carrying out in every programming action an arithmetic operation using the programming data bits held by the data latch circuits DLL and DLR, and is caused to be latched by the sense latch circuit SL. For instance, as typically shown in FIG. 34, if the programming data latched in the data latch circuits DLL and DLR are "01", the "01" state is the third programming state as shown in FIG. 35. Where the three-phased programming operation after the erase state in a procedure of generating programming states in the ascending order of the threshold voltage as shown in the second mode (Case 2) of FIG. 37, the result of the arithmetic operation using the programming data ("01") of the data latch circuits DLL and DLR in the programming action to obtain the first programming state in the first phase is logic "1"; that of the arithmetic operation using the programming data ("01") of the data latch circuits DLL and DLR in the programming action to obtain the second programming state in the second phase is logic "1"; and that of the arithmetic operation using the programming data ("01") of the data latch circuits DLL and DLR in the programming action to obtain the third programming state in the third phase is logic "0". These arithmetic operations are accomplished by running the SW circuits and the operation circuits. Therefore, a programming voltage is applied only in the third phase of programming, and the third programming state ("01") of the four values is realized in the pertinent memory cell.

When the programming operation is performed in three phases as described above, the programming data first latched into the data latch circuits DLL and DLR are not destroyed, and kept as they are. This is because of the control sequence in which two-bit programming data latched into the data latch circuits DLL and DLR are used for the arithmetic operation in every programming action and set into the sense latch circuit SL every time.

Figure 37:
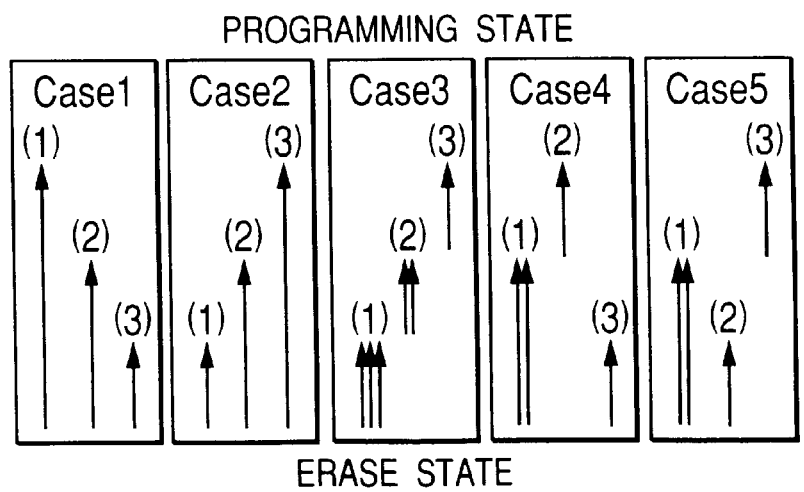
FIG. 37 illustrates in a patronized way the sequence of varying the threshold voltage in a programming action.

The sequence of varying the threshold voltage in the programming operation is not limited to the second mode (Case 2) of FIG. 37, but the setting may be in the descending order of the threshold voltage as in the first mode (Case 1); at the same varying rate of the threshold voltage for any programming state in one programming action as in the third mode (Case 3); or controlled as in the fourth mode (Case 4) or the fifth mode (Case 5).

When reading data, three voltages as word line selection levels to be applied to word lines are set; reading is done in three phases while successively changing the word line selection level; and two-value (one-bit) data read out of a memory cell in each individual reading action are latched into the sense latch circuit. Every time latching takes place, an arithmetic operation is carried out to have the sense-latched content to be reflected in the two-bit information of the data latch circuit. The two bits obtained in the data latch circuits DLL and DLR as a result of the three phases of sense latching are supposed to be the data matching the four-value information held by the pertinent memory cell.

In the multi-value flash memory 111 as well, the circuits for use in trimming on the constant current source described with reference to FIG. 1, FIG. 15 and FIG. 16 are used. It has the replica MOS transistor 2, external measuring terminal 3, control voltage generating circuit 10 and memory means 13; the control voltage vtri is supplied to circuits having a constant current source via the wiring 16; and that control voltage vtri is applied to the gate electrode of the replica MOS transistor 2. As circuits having a constant current source, the clamp circuit 7 is provided in the internal voltage generating circuit 130, the ring oscillator 5 and the delay circuit 4 in the mode control circuit 128, and the reference circuit 8 and the verify sense amplifier 9, in the memory section 113. It is thereby made possible in the multi-value flash memory as well to accomplish accurate measurement for the determination of the constant current moreover in a short period of time, and constant current characteristics can be aligned with high reliability even if there is any process unevenness.

Whereas the invention accomplished by the present inventor has been described in specific terms with reference to its preferred embodiments thereof, the invention is not limited to these embodiments, and obviously it can be modified in various ways without deviating from its essentials.

For instance, the means for trimming the constant current source pertaining to the invention is not limited to a flash memory and a microcomputer with a built-in flash memory but can be extensively applied to a wide variety of semiconductor device including semiconductor memories such as DRAMs and SRAMs, microcomputers into which such memories are built in, and graphics controllers with built-in flash memories. Also, circuits using a constant current source are not confined to those mentioned in the foregoing description but may be other appropriate circuits as well. The structure of flash memory cells is not restricted to the vertical stacking of floating gates and control gates, but one of conceivable alternative device structures is to use a floating gate electrode as the gate electrode of the MOS transistor and to use the channel region as the control gate electrode via a MOS gate capacitance formed by extending the gate electrode. Further, although the source voltages of various circuits were represented by a unified expression of . . . Vdd, this does not necessarily mean that these voltages are at the same level. Also, though the programming operation on the multi-value flash memory is divided broadly into three phases in the foregoing description is not the only applicable procedure, evidently the program operation can be done only once or in one type depending on what the programming data are. The flash memory is not limited to an on-chip configuration together with the microcomputer, but can be applied as a separate flash memory LSI to a flash memory card or the like.

What follows is a brief summary of advantages achieved in typical aspects of the present invention disclosed in this application.

Thus, various constant current source-applicable circuits hardly susceptible to unevenness of characteristics including delay circuits, ring oscillators and timers can be readily obtained, requiring no long-hour testing, irrespective of any unevenness of device characteristics among lots, wafers or chips or any temperature variation. Especially where a plurality of such constant current source-applicable circuits are provided over the same chip, the performance characteristics of all these circuits can be easily improved without having to test them for a longer period of time.

Therefore, semiconductor devices, microcomputers and flash memories permitting highly reliable adjustment can be obtained where the circuits involved are required to manifest desired characteristics unaffected by unevenness of device characteristics or the like.

What is claimed is:

1. A semiconductor integrated circuit, comprising:
   a memory circuit which holds control data;
   a voltage generating circuit which generates a control voltage in accordance with the control data;
   a plurality of circuits each of which includes a current source circuit generating a reference current in accordance with the control voltage;
   a signal line coupled to the voltage generating circuit to commonly provide the control voltage to the respective current source;
   a measuring transistor having a control terminal coupled to the signal line and a current terminal; and
   an external terminal which is coupled to the current terminal of the measuring transistor and which makes possible external measurement of a current flowing through the measuring transistor.

2. A semiconductor integrated circuit according to claim 1,
   wherein the current source circuit includes a current source MOS transistor receiving the control voltage at a control terminal and subjected to the control of mutual conductance.

3. A semiconductor integrated circuit according to claim 2, further comprising:
   a non-volatile memory element whose threshold voltage is electrically changeable;
   a control circuit which controls change of the threshold voltage of the non-volatile memory element; and
   a sense amplifier which detects whether or not the change of the threshold voltage by the control circuit has been completed,
   wherein the sense amplifier includes:
      a logic gate having a predetermined logic threshold voltage coupled to a data terminal of the non-volatile memory element;
      the current source circuit having the current source MOS transistor and generating a predetermined voltage in accordance with the current flowing through the current source MOS transistor; and
      a load MOS transistor coupled to receive the voltage generated by the current source circuit and subjected to mutual conductance control, the load MOS transistor supplying a current to the data terminal of the non-volatile memory element and controlling an input of the logic gate to a voltage in the vicinity of the logic threshold voltage when the threshold voltage of the non-volatile memory element has reached a predetermined state.

* * * * *